US012799583B2

(12) United States Patent
Chun

(10) Patent No.: US 12,799,583 B2
(45) Date of Patent: Nov. 17, 2026

(54) SUBSTRATE PROCESSING METHOD

(71) Applicant: ASM IP Holding B.V., Almere (NL)

(72) Inventor: Seungju Chun, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 671 days.

(21) Appl. No.: 18/199,058

(22) Filed: May 18, 2023

(65) Prior Publication Data

US 2024/0254619 A1 Aug. 1, 2024

Related U.S. Application Data

(60) Provisional application No. 63/441,549, filed on Jan. 27, 2023.

(51) Int. Cl.
*C23C 16/04* (2006.01)
*C23C 16/40* (2006.01)

(52) U.S. Cl.
CPC .......... *C23C 16/045* (2013.01); *C23C 16/402* (2013.01)

(58) Field of Classification Search
CPC .................................................. C23C 16/045
See application file for complete search history.

(56) References Cited

U.S. PATENT DOCUMENTS

2016/0358835 A1* 12/2016 Xie .................... H10W 74/137
2018/0166270 A1* 6/2018 Cho .................... H10P 14/6339
2020/0017967 A1* 1/2020 Abel ................ C23C 16/45536
2022/0108915 A1* 4/2022 Liu .................. H01J 37/32146

* cited by examiner

*Primary Examiner* — Joseph A Miller, Jr.
(74) *Attorney, Agent, or Firm* — Snell & Wilmer L.L.P.

(57) ABSTRACT

Provided is a substrate processing method for filling a gap structure without changing thin-film properties and without generating voids and pores, and the substrate processing method includes a first operation of forming a deposition inhibiting region on a structure including a gap by supplying a deposition inhibiting gas on the structure, a second operation of forming a thin film on the gap structure, and a third operation of removing the deposition inhibiting gas in the deposition inhibiting region by using at least one of gases used during the forming of the thin film.

21 Claims, 15 Drawing Sheets

(PRIOR ART)

SUBSTRATE PROCESSING METHOD

CROSS-REFERENCE TO RELATED APPLICATIONS

This application claims priority to U.S. Provisional Patent Application Ser. No. 63/441,549 filed Jan. 27, 2023 titled SUBSTRATE PROCESSING METHOD; the disclosure of which is hereby incorporated by reference in its entirety.

BACKGROUND

1. Field

The disclosure relates to a method of processing a substrate including a recess region, and more particularly, to a method of filling a gap structure.

2. Description of the Related Art

As the integration of semiconductor devices continues, the aspect ratio (A/R) of a gap structure also increases, and accordingly, the difficulty of the techniques for filling a gap structure without seams or voids is also increasing. A method of simply filling a gap by a deposition process has limitations, for example, the film-forming rate in an upper region of a gap structure is relatively higher than that in a lower region, such that an inlet portion of the gap is closed first, and accordingly, a void is formed inside the gap. Therefore, as an alternative thereto, a method of inhibiting a deposition in an upper region of a gap by supplying a deposition inhibiting gas has been used.

(a) of FIG. 1 illustrates that, in a case in which a process of depositing a film 11 on a gap structure 10 is performed without performing a deposition inhibiting operation in a gap filling process, an overhang occurs in an upper region of the gap structure 10, resulting in the formation of a void 12 in a gap. On the other hand, (b) and (c) of FIG. 1 illustrate vertical profiles of the film 11 in the upper region of the gap in cases in which nitrogen $N_2$ and nitrogen trifluoride ($NF_3$) are used in deposition inhibiting operations, respectively. In a case in which nitrogen is used as a deposition inhibiting gas, the deposition in the upper region of the gap may be inhibited, such that the gap has a V-shaped profile in which the cross-sectional area of the upper region of the gap is wider than that of the lower region, and thus, bottom-up gap filling may be performed without the formation of a void inside the gap.

In a case in which nitrogen trifluoride is used as a deposition inhibiting gas, as illustrated in (c) of FIG. 1, the deposition of the film 11 in the upper region of the gap may be inhibited, such that the gap has a V-shaped profile in which the cross-sectional area of the upper region of the gap is wider than that of the lower region. Accordingly, bottom-up gap filling may be performed without the formation of a void inside the gap. However, because a fluorine component has a stronger reducing power than that of a nitrogen component, the deposition inhibiting power when using nitrogen trifluoride as a deposition inhibiting gas is stronger than that when using nitrogen, and accordingly, the deposition inhibiting region of fluorine is wider and deeper in the gap filling process. Therefore, it may be seen that the use of fluorine is more advantageous than that of nitrogen in a bottom-up gap filling process.

However, when using a strong inhibiting gas such as fluorine, fluorine (F) remains in the deposited film, which may result in incomplete deposition and degrade the film-forming rate, film quality, and device performance.

In general, hydrogen ($H_2$) or ammonia ($NH_3$) plasma processing is used to remove fluorine. Active hydrogen species (e.g., hydrogen radicals or hydrogen ions) activated by radio-frequency (RF) power form a hydrogen fluoride gas (gaseous HF) through a chemical reaction with fluorine-terminated sites in a deposition inhibiting region to remove residual fluorine. That is, the fluorine-terminated sites may be removed.

However, when hydrogen is used to remove fluorine, some of the hydrogen fluoride formed by a reaction between the hydrogen and the fluorine may additionally etch a deposited thin film, and thus change the thickness of the thin film. In addition, when a large amount of hydrogen is used, thin-film properties may deteriorate, such as an increase of the etching rate of the thin film.

SUMMARY

The disclosure is to solve the above issues, and is to fill a gap without a void and a pore by removing fluorine (F) components that may remain in a film, while maintaining a deposition inhibiting effect, in a process of filling the gap.

In addition, the disclosure is to provide a method of filling a gap structure without a void and a pore without changing thin-film properties, particularly the thickness of a thin film and the etching rate of the thin film.

Additional aspects will be set forth in part in the description which follows and, in part, will be apparent from the description, or may be learned by practice of the presented embodiments of the disclosure.

According to one or more embodiments, a substrate processing method includes providing a wafer comprising a gap in a reaction chamber; providing a deposition inhibiting gas in the reaction chamber and subsequently purging the deposition inhibiting gas in the reaction chamber to provide a deposition inhibiting region in a top of the gap; providing a source gas and a reaction gas in the reaction chamber, supplying a radio-frequency (RF) power, and purging residue gas to deposit a layer in the gap; and providing the source gas without substantial reaction gas in the reaction chamber, supplying a radio-frequency (RF) power, and purging residue to at least partially remove the deposition inhibiting region.

In some embodiments, the deposition inhibiting gas comprises a halogen comprising gas.

In some embodiments, the halogen comprising gas may include a fluorine-containing gas.

In some embodiments, the fluorine-containing gas may include at least one of $NF_3$, $F_2$, $CF_4$, $BrF_3$, $SF_6$ and $ClF_3$, and a mixture thereof.

In some embodiments, supplying the fluorine-containing gas may comprise supplying the fluorine-containing gas at 50 sccm or less, while supplying a high frequency RF power of 200 W or less and/or a low frequency RF power of 100 W or less.

In some embodiments, the source gas supplied during the providing the source gas without substantial reaction gas removes residual fluorine formed in the deposition inhibiting region during the providing the deposition inhibiting gas.

In some embodiments, the source gas may be a silicon precursor, and may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; dimer-trisilylamine, trimer-trisilylamine, tetramer-trisilylamine, pentamer-trisilylamine, hexamer-trisilylamine, heptamer-trisilylamine, octamer-trisilylamine, and a mixture thereof.

In some embodiments, at least one of the number and positions of pores formed in the gap may be adjusted by adjusting the number of repetitions of the providing a source gas and a reaction gas in the reaction chamber, supplying a radio-frequency (RF) power, and purging residue gas relative to the number of repetitions of the providing the deposition inhibiting gas.

In some embodiments, the ratio of the number of repetitions of the providing the deposition inhibiting gas to the number of repetitions of the providing a source gas and a reaction gas in the reaction chamber, supplying a radio-frequency (RF) power, and purging residue gas may be about 1:1 to about 1:50.

In some embodiments, the number of pores formed in the gap may be adjusted by adjusting the number of repetitions of the providing the source gas without substantial reaction gas relative to the number of repetitions of the providing the deposition inhibiting gas.

In some embodiments, the ratio of the number of repetitions of the providing the deposition inhibiting gas to the number of repetitions of the providing the source gas without substantial reaction gas may be about 1:1 to about 1:50.

In some embodiments, the width in a middle region of the gap may be greater than the widths in an upper region and a lower region of the gap.

In some embodiments, the providing the deposition inhibiting gas may further include simultaneously supplying high-RF (HRF) power and low-RF (LRF) power to activate the deposition inhibiting gas.

In some embodiments, the RF power of the providing the source gas without substantial reaction gas may be HRF power, and the residual deposition inhibiting gas may be removed, by the providing the source gas without substantial reaction gas, from the deposition inhibiting region formed on an upper portion of the gap.

In some embodiments, the providing the deposition inhibiting gas to the providing the source gas without substantial reaction gas may be repeatedly performed until the gap is filled.

According to one or more embodiments, a substrate processing method includes a first operation of forming a deposition inhibiting region on a gap structure by performing, a plurality of times, supplying a deposition inhibiting gas on the gap structure; a second operation of forming a thin film on the gap structure by performing, a plurality of times, supplying a source gas on the gap structure, supplying a reaction gas, supplying a first radio-frequency (RF) power, and purging residue; and a third operation of removing a residual deposition inhibiting gas in the deposition inhibiting region by performing, a plurality of times, supplying the source gas that has a reactivity with the residual deposition inhibiting gas on the thin film, supplying second RF power, and purging residue, wherein a part of the source gas supplied during the third operation removes the deposition inhibiting region and a remaining part of the source gas supplied during the third operation remains inside the thin film.

According to one or more embodiments, a substrate processing method includes a first operation of forming a deposition inhibiting region on a structure including a gap by supplying a deposition inhibiting gas on the structure, a second operation of forming a thin film on the gap structure, and a third operation of removing a residual deposition inhibiting gas from the deposition inhibiting region by using at least one of gases used during the forming of the thin film, wherein the at least one of gases has a reactivity with the residual deposition inhibiting gas and removes the residual deposition inhibiting region.

In some embodiments, the width in a middle region of the gap may be greater than the width in an upper region of the gap, and, during the third operation, the residual deposition inhibiting gas may be removed from the deposition inhibiting region formed on an upper portion of the gap.

In some embodiments, the at least one of the gases may react with the residual deposition inhibiting gas in the deposition inhibiting region.

In some embodiments, a super-cycle may be defined as comprising one or more repetitions of the first operation, one or more repetitions the second operation, and one or more repetitions the third operation, and the gap may be filled by repeating the super-cycle.

In some embodiments, in the repeating of the super-cycle, the gap may be filled while maintaining a deposition inhibiting effect without forming voids and pores in the gap, by adjusting a repetition ratio of the first operation, the second operation, and the third operation.

According to one or more embodiments, a substrate processing method includes providing a substrate comprising a gap into a reaction chamber and filling the gap with a film by performing a cyclical deposition process, wherein the cyclical deposition process comprises a first operation of supplying a fluorine-containing gas to form fluorine-terminated sites on the gap, a second operation of supplying a source gas and a reaction gas to form a thin film on the gap on which the fluorine-terminated sites are formed, and a third operation of supplying the source gas on the thin film, wherein the source gas has a reactivity with fluorine, and the source gas supplied during the third operation removes excess residual fluorine.

In some embodiments, the source gas may be a silicon-containing gas.

In some embodiments, the reaction gas may be an oxygen-containing gas, and may include at least one of $O_2$, $O_3$, $O_2$ plasma, $O_3$ plasma, water vapor, $H_2O$ plasma, NO, NO plasma, $N_2O$, $N_2O$ plasma, $NO_2$, $NO_2$ plasma, hydrogen peroxide, CO, CO plasma, $CO_2$, $CO_2$ plasma, and a mixture thereof.

In some embodiments, the reaction gas may be a nitrogen-containing gas, and may include at least one of NO, NO plasma, $N_2O$, $N_2O$ plasma, $NO_2$, $NO_2$ plasma, nitrogen ($N_2$), ammonia ($NH_3$), hydrazine ($N_2H_4$), diazene ($N_2H_2$), $N_2$ plasma, $NH_3$ plasma, and a mixture thereof.

BRIEF DESCRIPTION OF THE DRAWINGS

The above and other aspects, features, and advantages of certain embodiments of the disclosure will be more apparent from the following description taken in conjunction with the accompanying drawings, in which.

Figure 4:
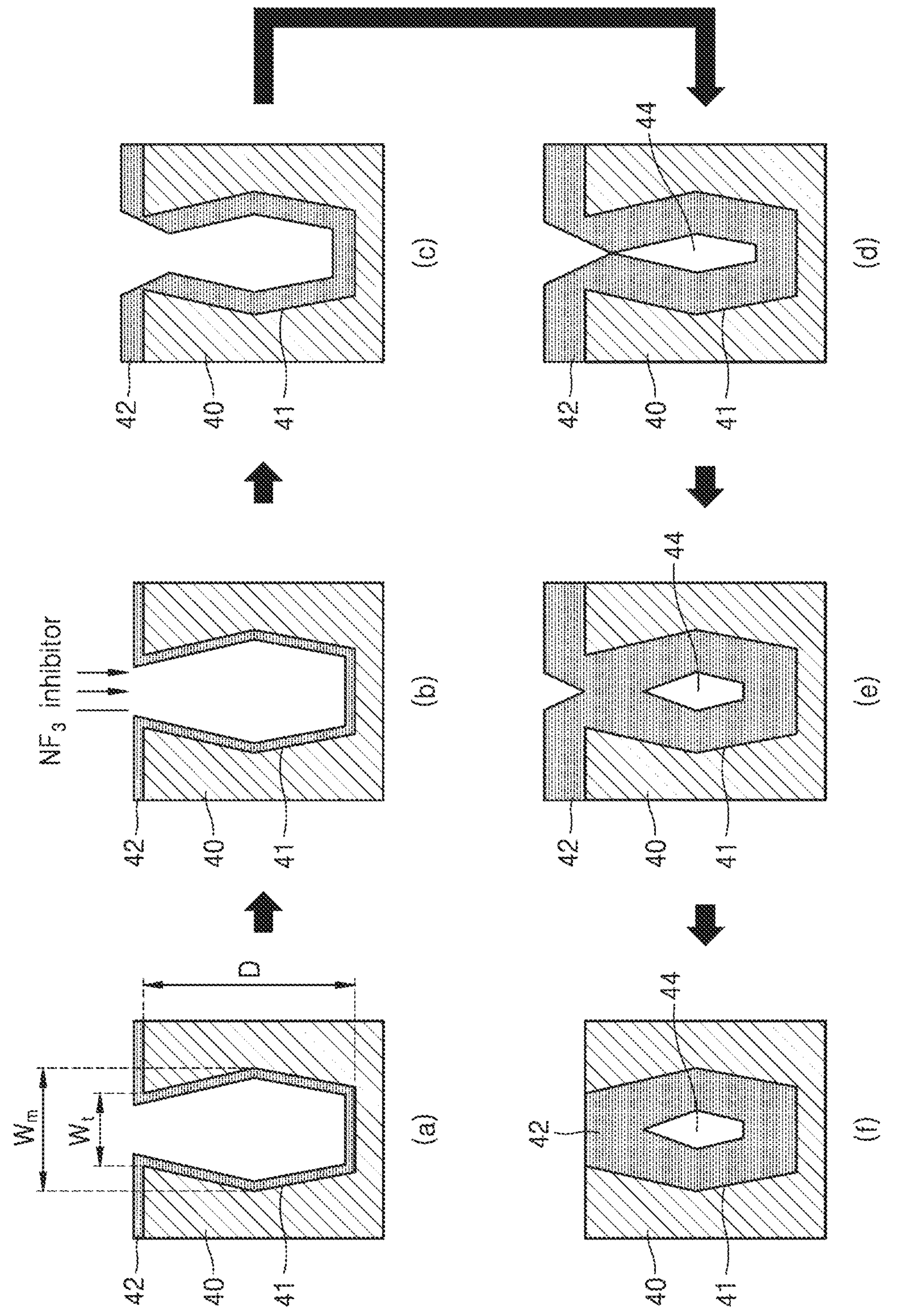
Figure 5:
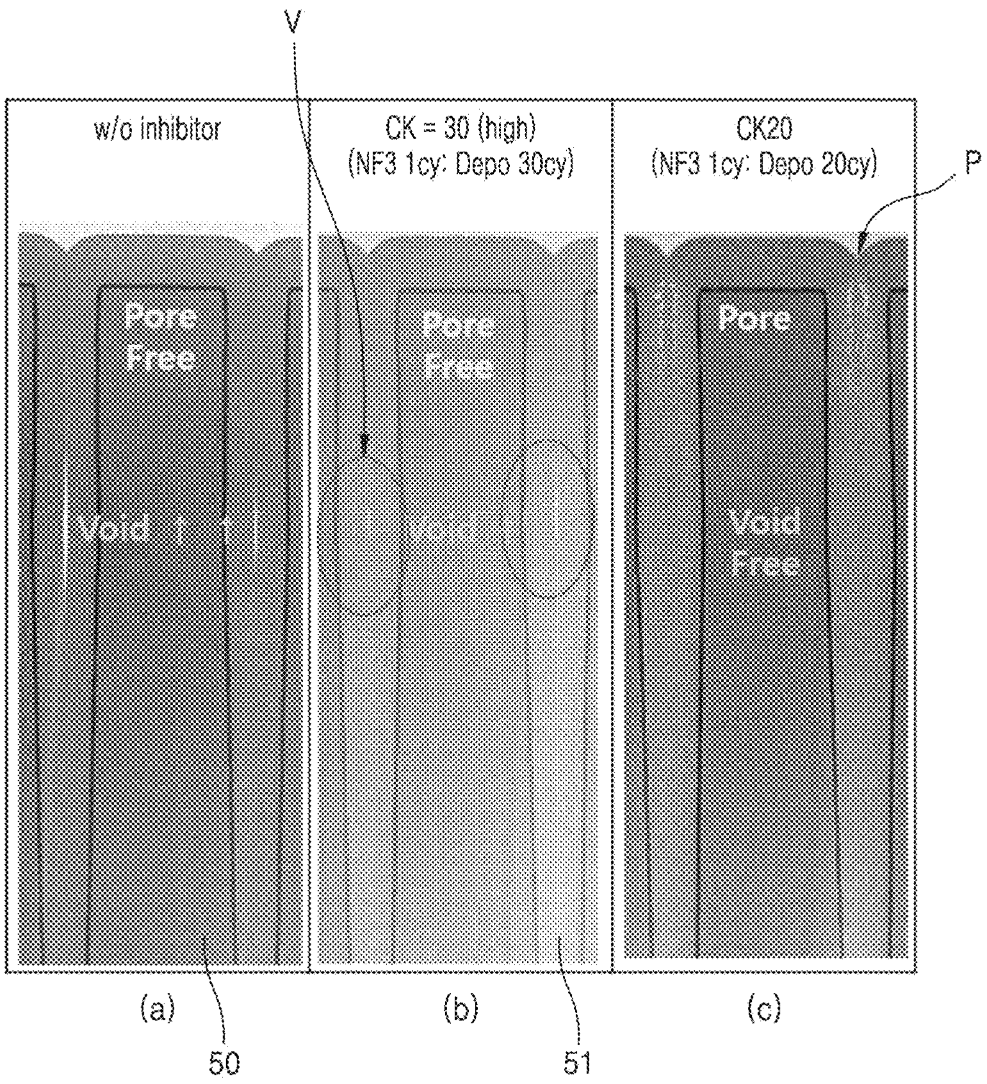
Figure 6:
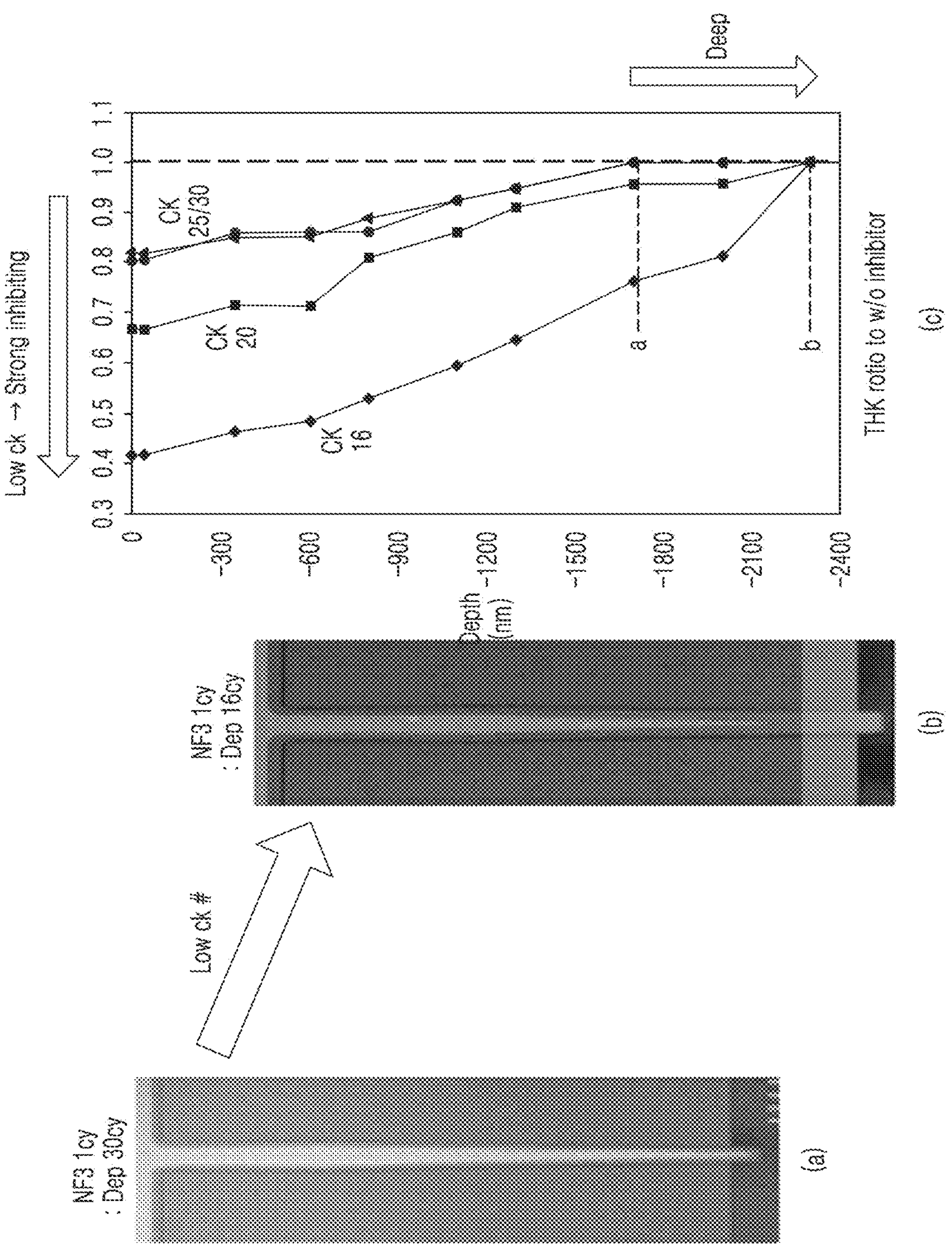
Figure 7A:
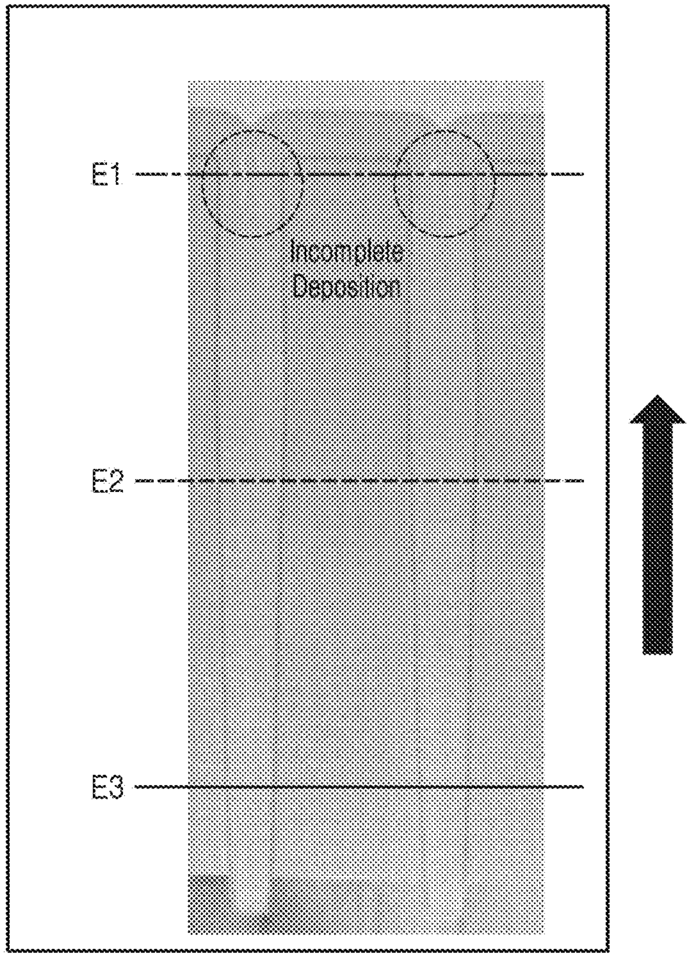
Figure 7B:
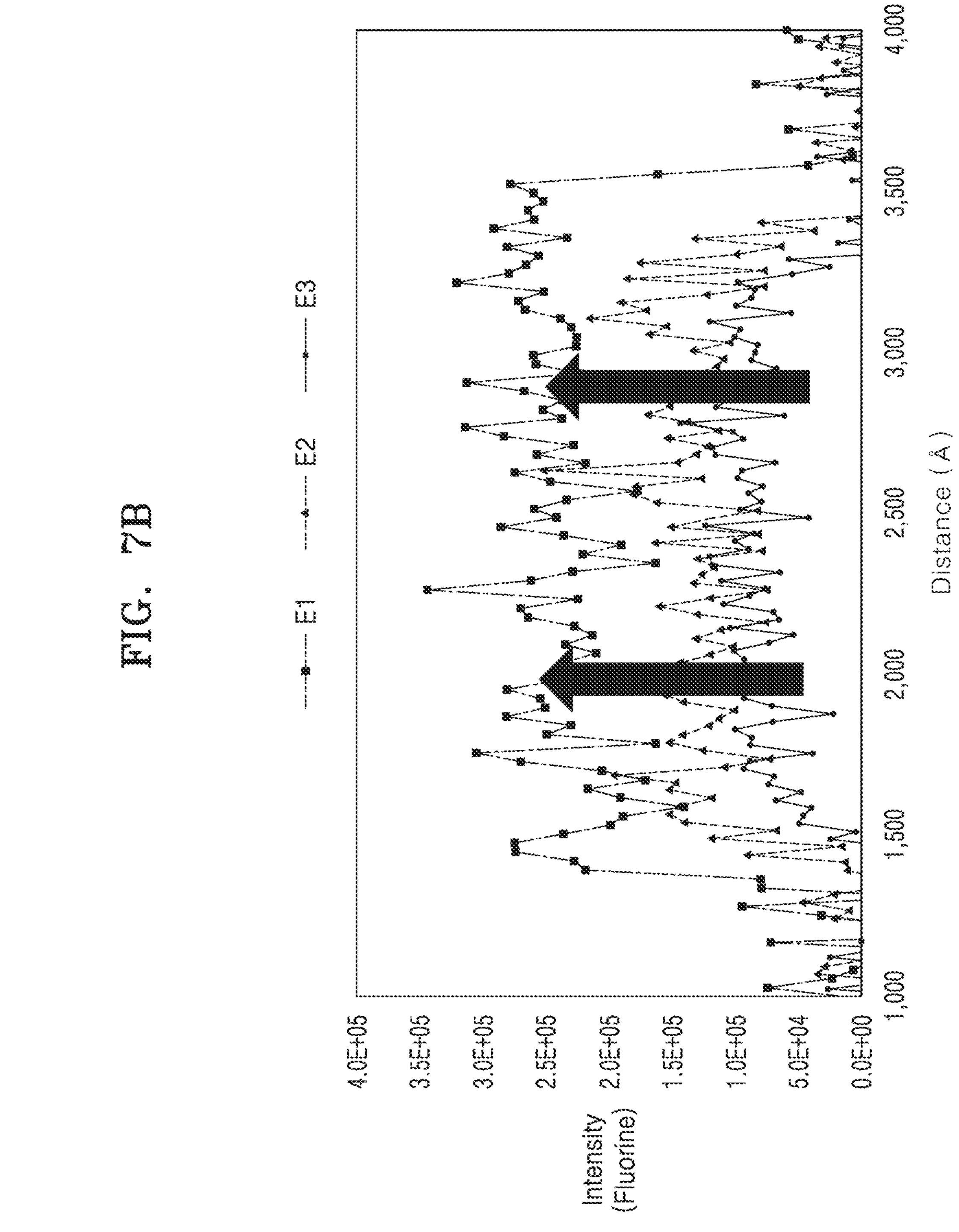
Figure 8:
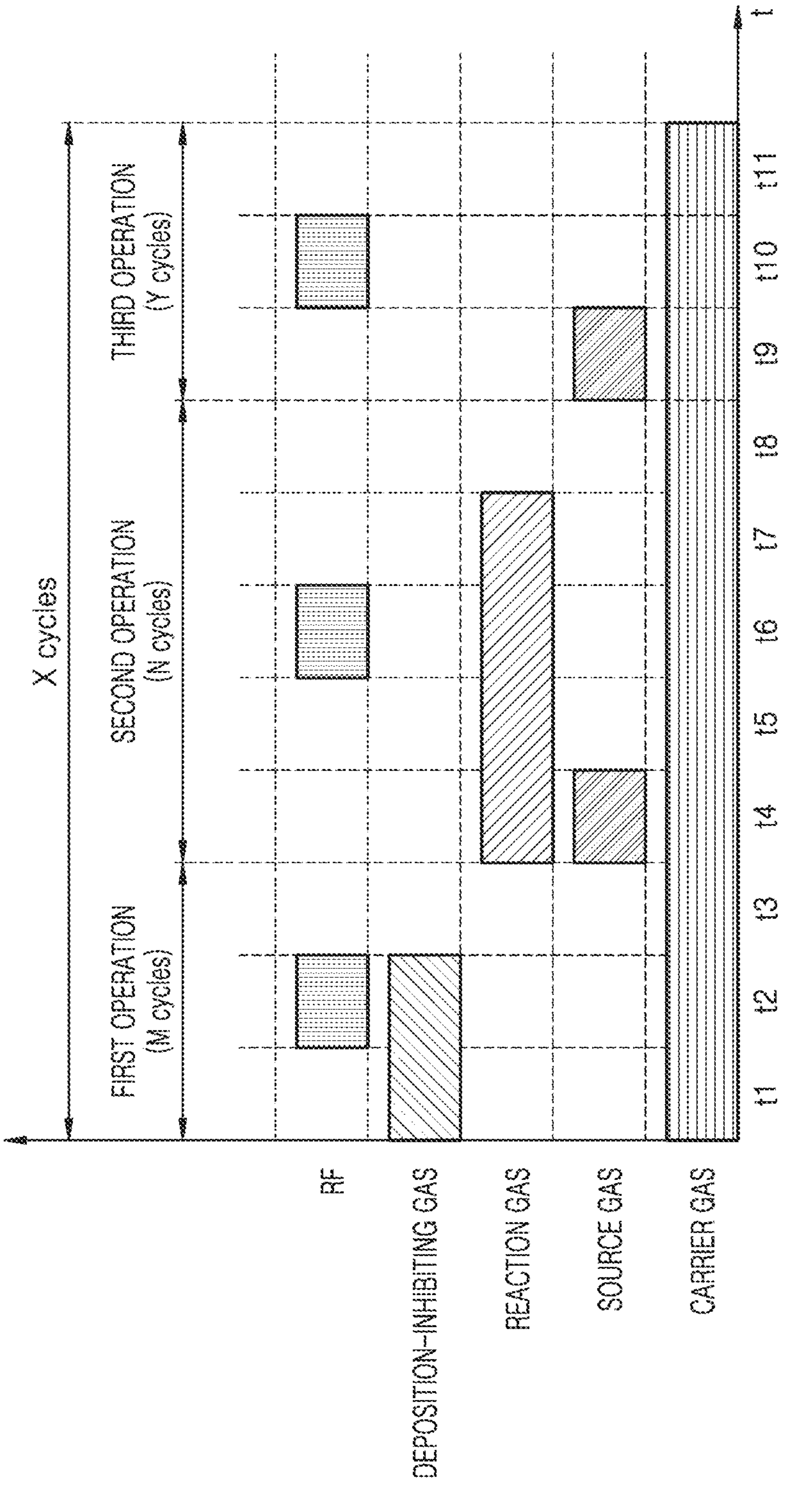
Figure 9:
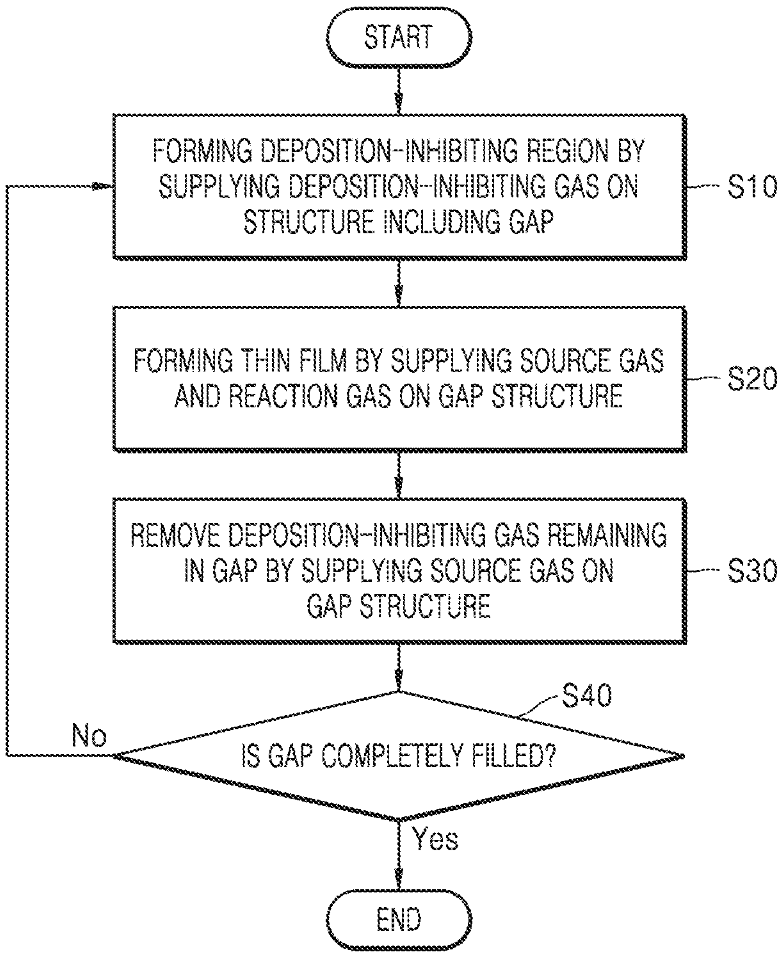
Figure 10:
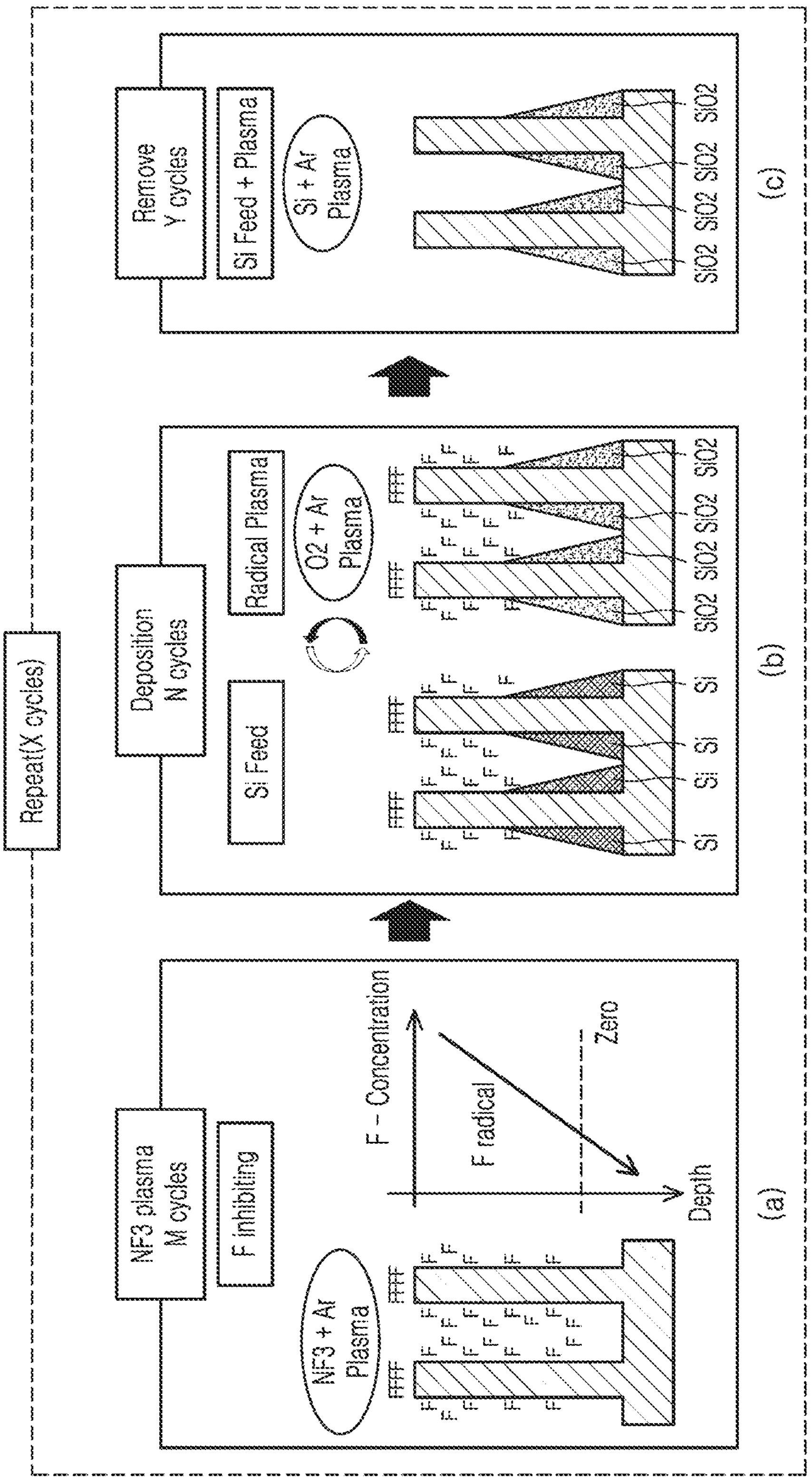
Figure 11:
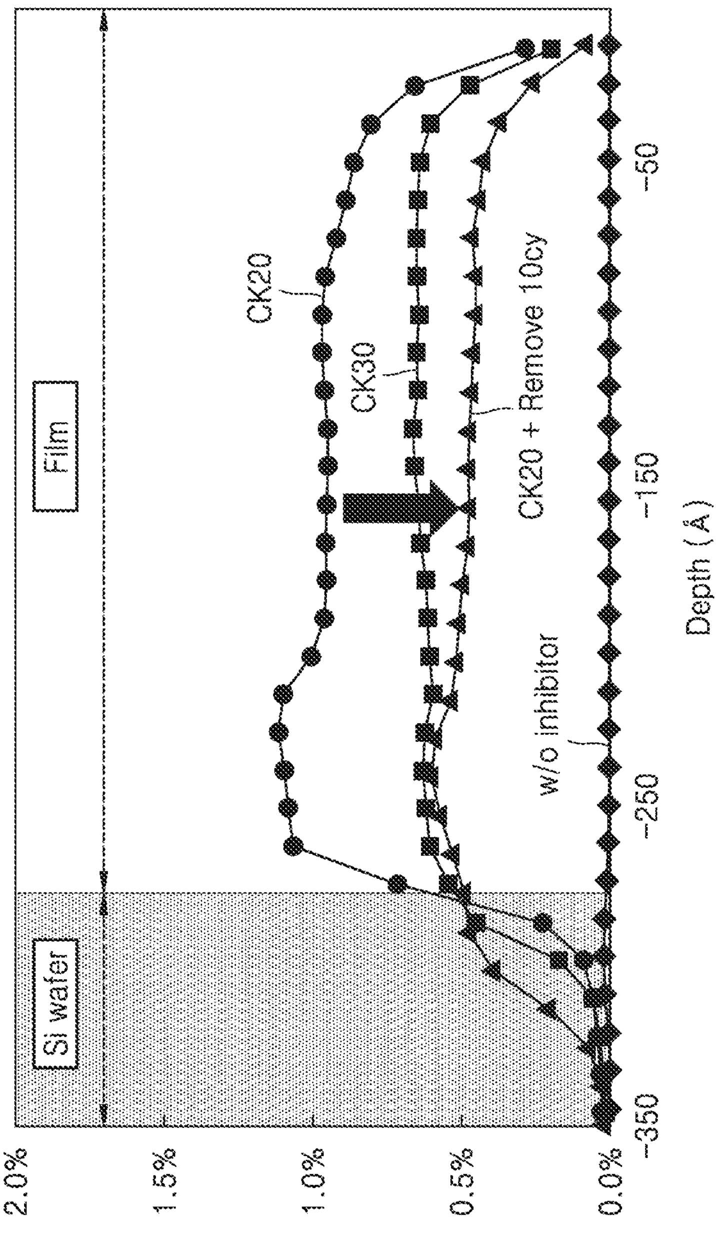
Figure 12:
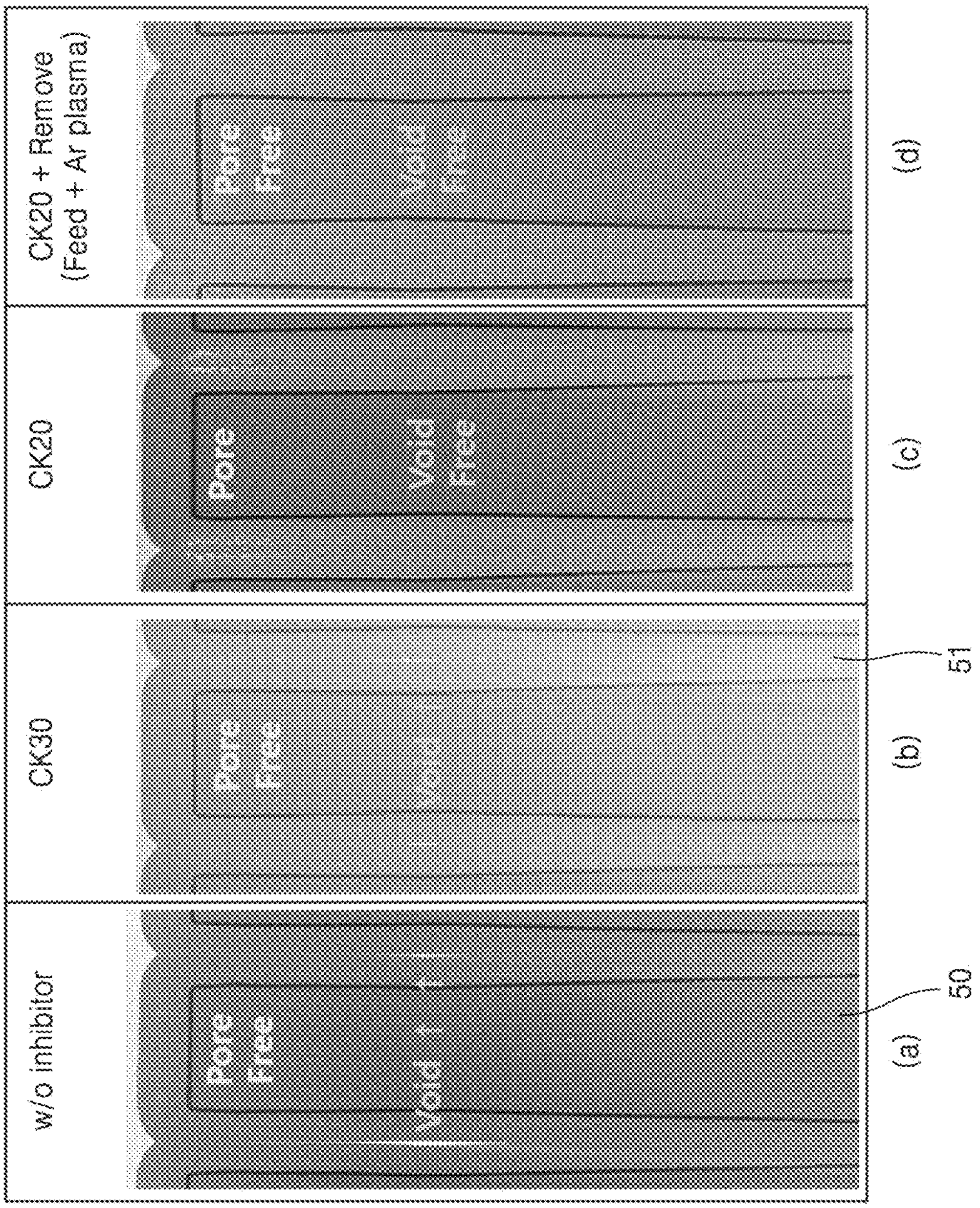
Figure 13:
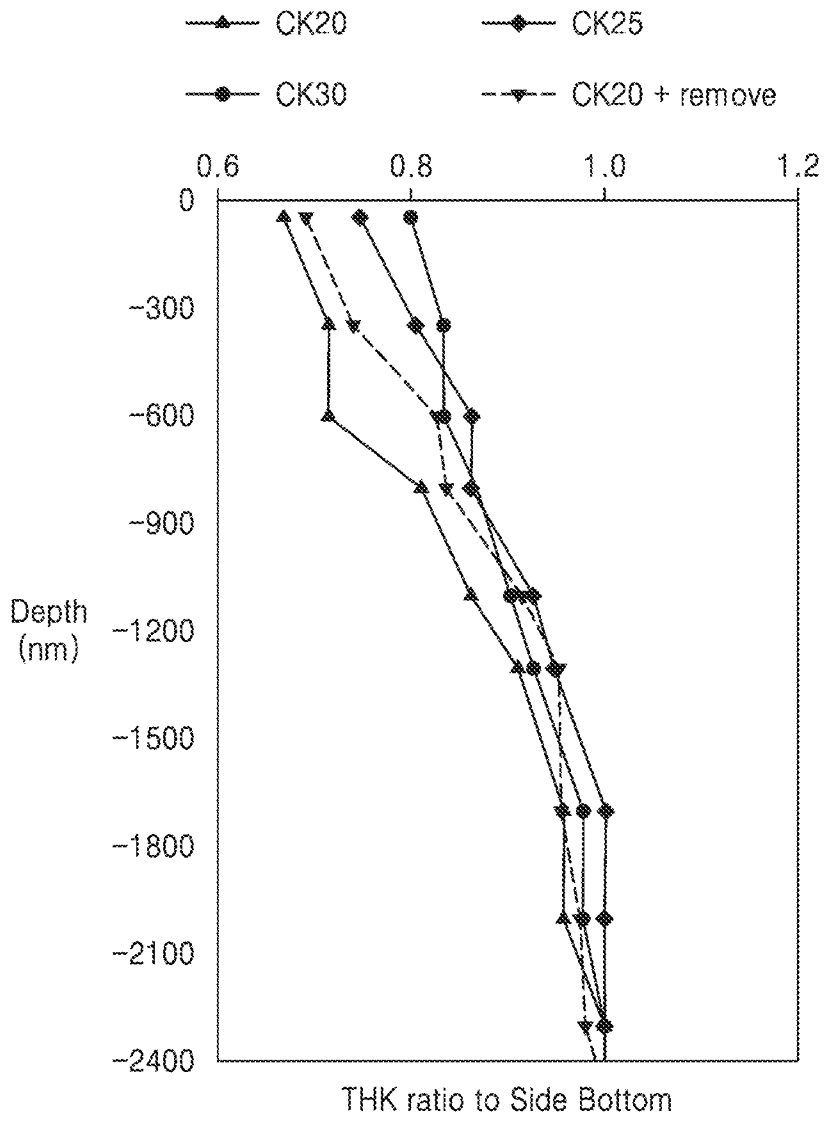

(a) to (f) of FIG. 4 are cross-sectional views conceptually illustrating a process in which a void is formed when a thin film is deposited on a non-vertical gap structure;

FIG. 5 is a diagram for comparing the occurrence of voids and/or pores in a gap structure according to the number of repetitions of a second operation relative to the number of repetitions of a first operation;

FIG. 6 is a diagram for comparing a deposition profile according to the number of repetitions of the second operation with respect to the number of repetitions of the first operation, with a deposition profile in a case in which no deposition inhibiting gas is used;

FIGS. 7A and 7B are diagrams for comparing fluorine concentrations in an upper region, a middle region, and a lower region of a gap structure on which a gap filling process in FIG. 5 (*c*) is completed;

FIG. 8 is a diagram illustrating a process sequence of a gap filling process according to an additional embodiment;

FIG. 9 is a flowchart of a gap filling process according to additional embodiments;

FIG. 10 schematically illustrates a method of forming a film according to additional embodiments;

FIG. 11 is a graph for schematically comparing fluorine concentrations according to depth in a case in which a residual-fluorine removal operation is performed according to additional embodiments and a case in which the residual-fluorine removal operation is not performed;

FIG. 12 is a diagram for comparing the occurrence of voids and/or pores in a gap structure in a case in which a residual-fluorine removal operation is performed according to additional embodiment and in a case in which the removal operation is not performed;

FIG. 13 is a diagram for comparing deposition profiles in a case in which a residual-fluorine removal operation is performed according to additional embodiments and in a case in which the residual-fluorine removal operation is not performed.

Figure 14:
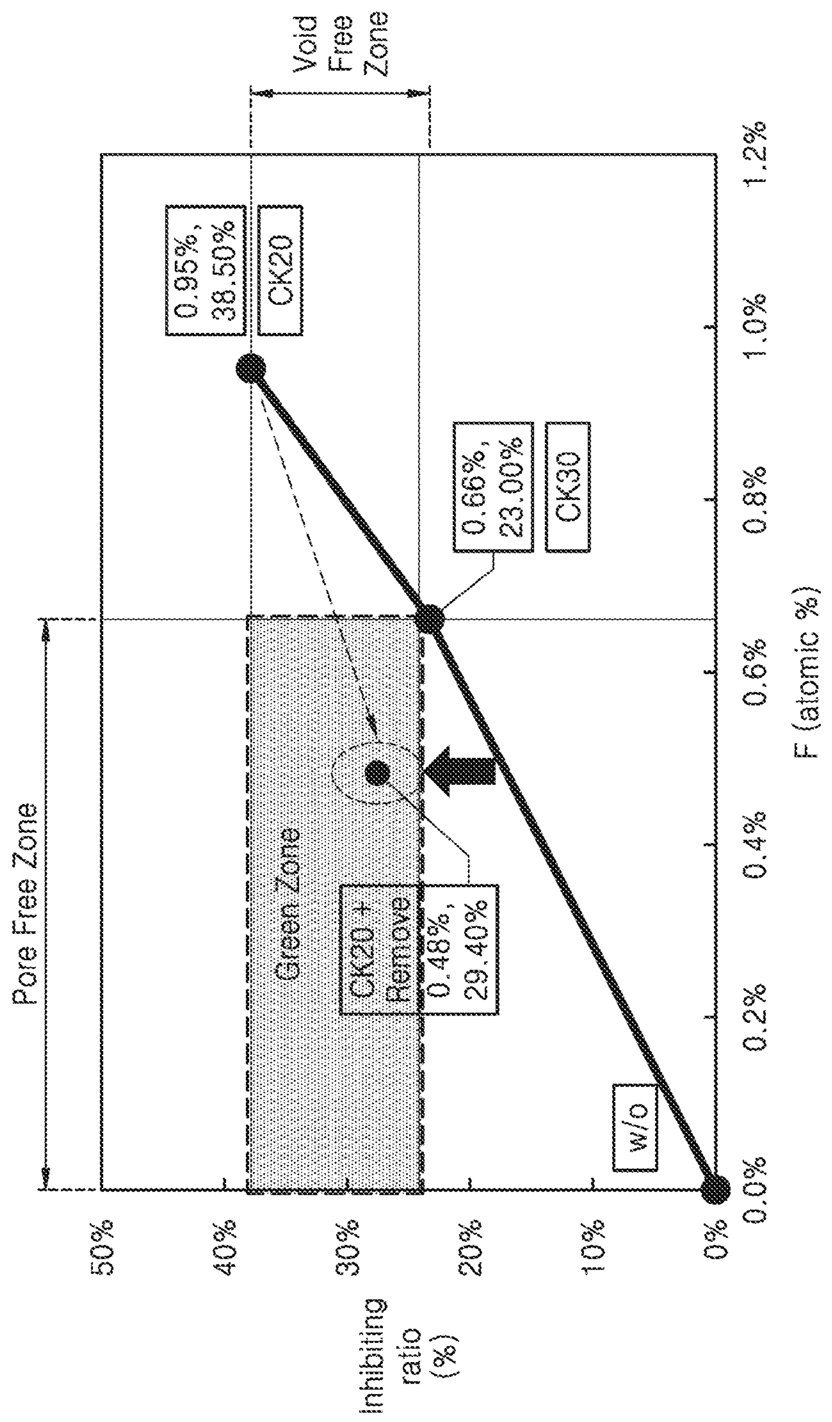

FIG. 14 is a graph for schematically comparing fluorine concentrations, deposition inhibiting effects, and pore and void inhibiting effects in a case in which the residual-fluorine removal operation is performed according to additional embodiments and a case in which the residual-fluorine removal operation is not performed.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, preferable embodiments will be described in detail with reference to the accompanying drawings.

The embodiments are provided to further explain the disclosure to those of skill in the art, and the following embodiments may have different forms and the scope of the disclosure should not be construed as being limited to the descriptions set forth herein. Rather, these embodiments are provided such that the disclosure will be thorough and complete, and will fully convey the scope of the disclosure to those skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated shapes, numbers, processes, members, components, and/or groups thereof, but do not preclude the presence or addition of one or more other shapes, numbers, operations, members, components, and/or groups thereof. As used herein, the term "and/or" includes any and all combinations of one or more of the associated listed items.

It will be understood that, although the terms such as "first" or "second" may be used herein to describe various operations, members, regions, and/or sections, these operations, members, regions, and/or sections should not be limited by these terms. These terms do not denote any particular order, vertical position, or superiority, but rather are only used to distinguish one operation, member, region, or section from another operation, member, region, or section. Thus, a first operation, member, region, layer, or section discussed below may refer to a second operation, member, region, or section without departing from the teachings of the disclosure.

Hereinafter, embodiments will be described with reference to drawings schematically illustrating ideal embodiments. In the drawings, variations from the illustrated shapes as a result, for example, of manufacturing techniques and/or tolerances, may be expected. Thus, the embodiments should not be construed as being limited to the particular shapes of regions illustrated herein but may be to include deviations in shapes that result, for example, from manufacturing.

First, a gap filling process for forming a deposition inhibiting region to fill a gap without forming a void inside a gap will be described.

Figure 2:
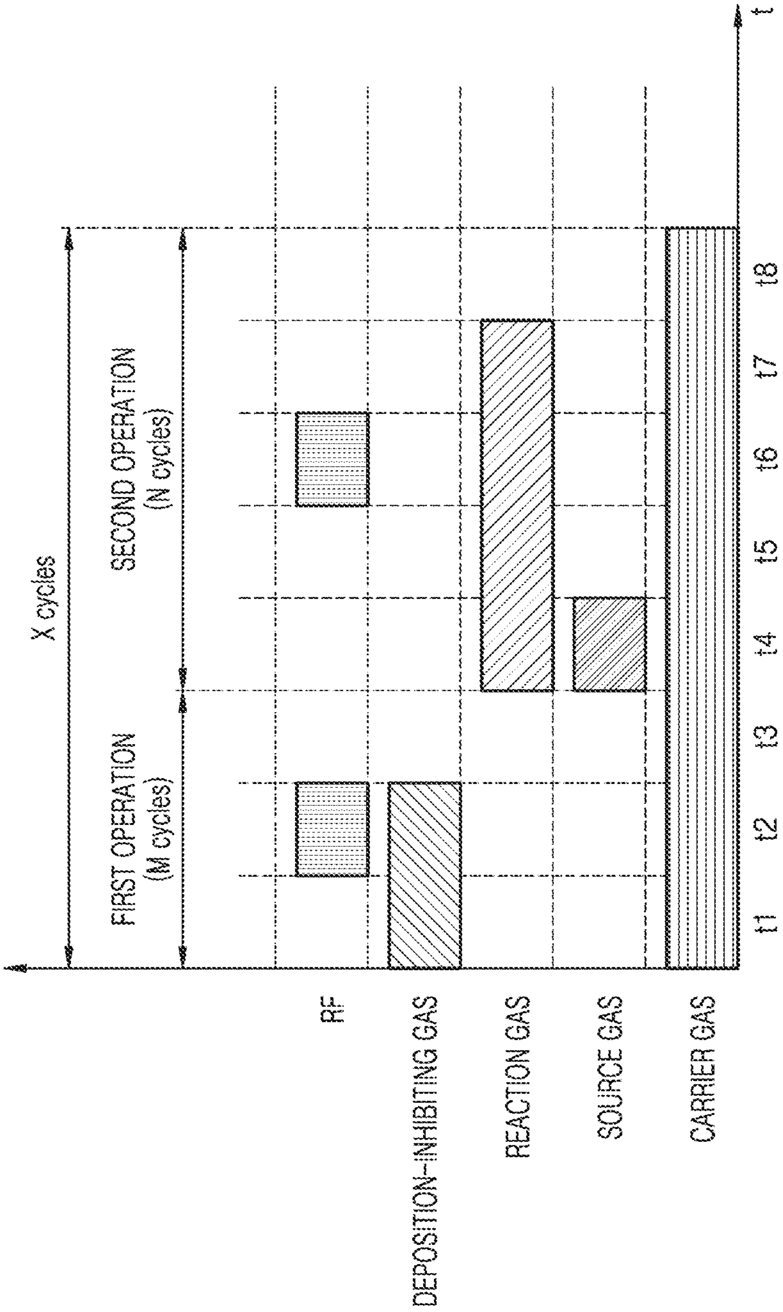
FIG. 2 is a diagram illustrating a process sequence of a gap filling process according to embodiments.

FIG. 2 is a diagram illustrating a process sequence of a gap filling process according to embodiments. Referring to FIG. 2, the gap filling process largely includes a deposition inhibiting operation and a deposition operation.

First, a first operation of forming a deposition inhibiting region by supplying a deposition inhibiting gas on a structure including a gap having an upper surface, a lower surface, and a sidewall connecting the upper surface to the lower surface may be performed. In detail, the operation of forming the deposition inhibiting region on the structure may be performed by performing, a plurality of times (M cycles), the first operation including supplying the deposition inhibiting gas on the structure including the gap, supplying radio-frequency (RF) power, and purging residue. The first operation may be repeated one or more times (i.e., M≥1), and as the first operation is repeated, the deposition inhibiting effect may increase. Sub-operations included in the first operation are as follows.

First Sub-Operation (t1)

In order to form a deposition inhibiting region on a structure including a gap having an upper surface, a lower surface, and a sidewall connecting the upper surface to the lower surface, supplying a deposition inhibiting gas may be performed during a first sub-operation (t1).

As the deposition inhibiting gas, a nitrogen-containing gas, for example, at least one of $N_2$, $NH_3$, and $N_2+H_2$, and a mixture thereof, may be used. In another example, at least one or a mixture of fluorine-containing gases, such as $NF_3$, $F_2$, $CF_4$, $BrF_3$, $SF_6$, or $ClF_3$, may be used as the deposition inhibiting gas. In another example, the deposition inhibiting gas may be a halogen-containing compound, and may be, for example, a compound containing fluorine (F), chlorine (Cl), bromine (Br), iodine (I), or the like. In detail, the deposition inhibiting gas may be one or more selected from the group consisting of $F_2$, $SF_6$, $CF_4$, $C_2F_6$, $CHF_3$, $CH_2F_2$, $ClF_3$, $NF_3$, $C_3F_8$, $C_4F_8$, HF, $SiF_4$, $BrF_3$, $ClF_3$, $Cl_2$, HCl, $BCl_3$, $CCl_4$, $SiCl_4$, $SiHCl_3$, $SiH_2Cl_2$, $SizCl_6$, $CHCl_3$, $CH_2Cl_2$, $CH_3Cl$, $PCl_3$, $PCl_5$, $POCl_3$, $NCl_3$, $S_2Cl_2$, $SOCl_2$, $SO_2Cl_2$, $COCl_2$, and HBr.

The flow rate for supplying the deposition inhibiting gas may be about 50 sccm or less, more specifically about 5 sccm to about 50 sccm. In the disclosure, a small amount of activated deposition inhibiting gas may be supplied in order to form a non-conformal distribution of deposition inhibiting sites along the surface of the gap. That may result in more inhibiting sites at the upper region than at the lower region of the gap. To that end, a small flow rate of deposition inhibiting gas may be supplied, while supplying a low RF power.

The deposition inhibiting gas may be carried by a carrier gas. The carrier gas is an inert gas, and argon (Ar), helium (He), nitrogen ($N_2$), neon (Ne), etc. may be used as the carrier gas, but the carrier gas is not limited thereto. The flow rate of the carrier gas may be appropriately selected considering factors, such as the deposition rate of the deposition inhibiting region, the vapor pressure of the deposition inhibiting gas to be transported, or the temperature, and for example, about 1000 sccm to about 3000 sccm of Ar or nitrogen ($N_2$) gas may be supplied as the carrier gas. The carrier gas serves to transport a source gas, a reaction gas, and a deposition inhibiting gas during a substrate processing process, but may also serve as a purge gas to remove residual gas in a reactor.

Second Sub-Operation (t2)

Thereafter, the deposition inhibiting gas may be activated by applying plasma to a reaction space in which the substrate is mounted. The plasma may be generated by supplying RF power to the reactor. During the second sub-operation (t2), plasma may be applied while continuously supplying the deposition inhibiting gas to the substrate.

The activated deposition inhibiting gas may leave a layer of ionized nitrogen or halogen element on the upper surface, the lower surface, and the sidewalls, which may constitute a deposition inhibiting region or a portion thereof. In detail, as a result of applying the plasma, a layer of nitrogen (N), fluorine (F), chlorine (Cl), bromine (Br), iodine (I), or the like may be formed on the upper surface, the lower surface, and the sidewall. For example, fluorine active species may be adsorbed on the surface of the gap structure to form fluorine-terminated sites, and active nitrogen species may be adsorbed on the surface of the gap structure to form nitrogen-terminated sites. The high reducing power of such fluorine-terminated site and/or active nitrogen species may form a deposition inhibiting region capable of inhibiting deposition of a film in an upper region of the gap.

Thus, by this operation, deposition of a film in the upper region of the gap may be inhibited such that the gap has a V-shaped profile in which the cross-sectional area of the upper region of the gap is wider than that of the lower region.

The time period for applying the plasma (i.e., the duration of the second sub-operation (t2)) may be about 0.1 second to about 1 second. In another embodiment, in order to apply the plasma, dual-RF frequency power, i.e., high-frequency RF power and low-frequency RF power may be simultaneously supplied to the reaction space. For example, the high-frequency RF power may have a frequency of about 10 MHz to 30 MHz, and may be supplied with power of 200 W or less, more specifically about 100 W to about 200 W. For example, the low-frequency RF power may have a frequency of about 300 kHz to 500 kHz, and may be supplied with power of 100 W or less, more specifically about 50 W to about 100 W. The high-frequency RF power increases the ionization rate of the deposition inhibiting gas and increases the density of the active species. In addition, the low-frequency RF power may increase a travel distance of the active species to uniformly form the deposition inhibiting region to the sidewall and the lower surface of the gap. The deposition inhibiting regions may be formed on the upper surface, the lower surface, and the sidewall while the deposition inhibiting gas is activated and decomposed by the supply of the RF power and the application of the dual plasma.

Third Sub-Operation (t3)

Thereafter, the reaction space may be purged. The application of the plasma may be stopped to purge the reaction space.

In some embodiments, the purge may be performed by continuously flowing, during the third sub-operation (t3), the carrier gas used in the above-described plasma applying operation. As the flow rate of the carrier gas, for example, about 1000 sccm to about 6000 sccm of Ar or $N_2$ may be supplied. In the purge operation, residual gas remaining in the reactor may be removed. For example, reaction byproducts decomposed by the plasma and elements that are not adsorbed to the gap structure may be removed.

The time period during which the purge is performed (i.e., the duration of the third sub-operation (t3)) may be about 0.1 second to about 1 second.

The above sub-operations (t1 to t3) may constitute the first operation. The first operation may be repeated one or more times until the deposition inhibiting region is sufficiently formed.

When the deposition inhibiting region is sufficiently formed, a deposition operation of forming a thin film on the gap structure (in this case, the second operation) may be performed. In detail, an operation of forming the thin film on the structure may be performed by performing, a plurality of times (N cycles), the second operation including supplying a source gas, supplying a reaction gas on the structure, supplying RF power, and purging residue. The second operation may be repeated one or more times (i.e., $N \geq 1$). Sub-operations included in the second operation are as follows.

Fourth Sub-Operation (t4)

Supplying a source gas and a reaction gas on the gap structure may be performed. The source gas and the reaction gas may be selected according to the type of a film to be formed on the substrate.

In some embodiments, the film may be a silicon oxide layer, the source gas may be a silicon precursor containing silicon, and the reaction gas may be an oxidizing agent containing oxygen. In some other embodiments, the film may be a silicon nitride layer, the source gas may be a silicon precursor containing silicon, and the reaction gas may be a compound containing nitrogen.

In detail, the silicon precursor may be, for example, one or more selected from the group consisting of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N$ (tBu); DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; dimer-trisilylamine, trimer-trisilylamine, tetramer-trisilylamine, pentamer-trisilylamine, hexamer-trisilylamine, heptamer-trisilylamine, and octamer-trisilylamine.

The reaction gas may be, for example, one or more selected from the group consisting of $O_2$, $O_3$, $O_2$ plasma, $O_3$ plasma, water vapor, $H_2O$ plasma, NO, NO plasma, $N_2O$, $N_2O$ plasma, $NO_2$, $NO_2$ plasma, hydrogen peroxide, CO, CO plasma, $CO_2$, $CO_2$ plasma, nitrogen ($N_2$), ammonia ($NH_3$), hydrazine ($N_2H_4$), diazene ($N_2H_2$), $N_2$ plasma, $NH_3$ plasma, and the mixture thereof. In a case in which a reaction gas that is not activated by plasma is supplied, the source gas and the reaction gas do not chemically react, and the reaction gas may be a reactive purge gas that simply serves as a purge gas.

In some embodiments, the flow rate for supplying the source material may be about 100 sccm to about 3000 sccm, and the flow rate for supplying the reactant may be about 500 sccm to about 2000 sccm.

When the flow rate for supplying the source material is too low, it may take too long to form a film having a desired thickness. When the flow rate for supplying the source material is too high, the source material may be unnecessarily consumed, which may be economically disadvantageous, and a purge time in a subsequent purge operation may increase, resulting in a long substrate processing time. That is, the source material is chemisorbed on the surface of the substrate in a self-limiting manner, and when the flow rate of the supplied source material is too high, an excessive amount of source material that is not chemisorbed remains, resulting in a decrease in substrate processing speed.

In another embodiment, the source material may be carried by a carrier gas. The carrier gas is an inert gas, and argon (Ar), helium (He), nitrogen ($N_2$), neon (Ne), etc. may be used as the carrier gas, but the carrier gas is not limited thereto. The flow rate of the carrier gas may be appropriately selected considering factors, such as the flow rate of the source material, the vapor pressure of the source material to be transported, or the temperature, and for example, about 1000 sccm to about 3000 sccm of an Ar or nitrogen ($N_2$) gas may be supplied as the carrier gas.

In some embodiments, the duration of the fourth sub-operation (t4) in which the source material is supplied may be about 0.1 second to about 1 second.

By supplying the source material, the source material may be adsorbed to an adsorption site on the gap structure to which the source material may be adsorbed.

As described above, because the deposition inhibiting region is formed on the upper surface, the lower surface, and the sidewall of the gap, absorption of the source material may be extremely limited at the beginning of the second operation of forming the film. However, as the second operation of forming the film is repeated, the number of times of purging increases and the deposition inhibiting region is gradually removed, and accordingly, the range in which the source gas is adsorbed may gradually increase.

Fifth Sub-Operation (t5)

Thereafter, the supply of the source gas may be stopped and the reaction space may be purged.

In some embodiments, the purge may be performed by continuously flowing, during the fifth sub-operation t5, the carrier gas used in the operation (t4) of supplying the source gas and the reaction gas described above. As the flow rate of the carrier gas, for example, about 200 sccm to about 3000 sccm of Ar or nitrogen gas ($N_2$) may be supplied.

In some embodiments, the reaction gas may be continuously supplied while the purge is performed. The flow rate of the reaction gas may be identical to that in the fourth sub-operation (t4).

The time period during which the purge is performed (i.e., the duration of the fifth sub-operation (t5)) may be about 0.1 second to about 1 second.

Sixth Sub-Operation (t6)

Thereafter, plasma may be generated in the reaction space to activate the reaction gas. That is, the plasma may be generated while continuously supplying the reaction gas during the sixth sub-operation (t6). The plasma may be generated by applying RF power to the reaction space.

The activated reactant may react with the source gas adsorbed on the gap structure to form a film.

The time period for applying the plasma (i.e., the duration of the sixth sub-operation (t6)) may be about 0.1 second to about 1 second. At this time, in order to apply the plasma, high-frequency RF power having a frequency of about 13.56 MHz may be supplied to the reaction space, at power of about 100 W to about 400 W. In some embodiments, unlike in the first sub-operation, low-frequency RF power having a frequency of about 400 kHz may not be supplied.

In some embodiments, the reaction gas may be continuously supplied while the plasma is applied. The flow rate of the reaction gas may be identical to that in the fourth sub-operation (t4). The reaction gas may be carried by a carrier gas.

Seventh Sub-Operation (t7)

Thereafter, the application of the plasma may be stopped and the reaction space may be purged.

In some embodiments, the purge may be performed by supplying a carrier gas to the reaction space during the seventh sub-operation (t7). In some embodiments, the reaction gas may be continuously supplied while the purge is performed. The flow rate of the reaction gas may be identical to that in the fourth sub-operation (t4).

The time period during which the purge is performed (i.e., the duration of the seventh sub-operation (t7)) may be about 0.1 second to about 1 second.

Eighth Sub-Operation (t8)

Thereafter, the reaction space may be purged. In some embodiments, the purge may be performed by continuously flowing, during the eighth sub-operation (t8), the carrier gas used in the previous sub-operations. In the purge operation, residual gas remaining in the reactor may be removed. The time period during which the purge is performed (i.e., the duration of the eighth sub-operation (t8)) may be about 0.1 second to about 1 second.

The above sub-operations (t4 to t8) may constitute the second operation. The second operation may be repeated one or more times until the film is sufficiently formed.

The ratio of the number of repetitions of the first operation (M) to the number of repetitions of the second operation (N) may be about 1:1 to about 1:50. In some embodiments, the ratio of M to N is about 1:2 to about 1:38, about 1:5 to about 1:36, about 1:10 to about 1:34, about 1:15 to about 1:30, about 1:20 to about 1:30, or any range therebetween.

The ratio of M to N (the ratio of the number of repetitions of the first operation to the number of repetitions of the second operation) may be determined considering the type of the deposition inhibiting gas used, deposition conditions, and the like. When the ratio of M to N is too high (i.e., when M is excessively high), the film may not be formed or may be formed too slowly. When the ratio of M to N is too low (i.e., when N is excessively high), the selectivity of formation of the film may be reduced.

The first and second operations may constitute a super-cycle for forming the film, and the super-cycle may be performed one or more times (X times) until the gap is filled.

Figure 3:
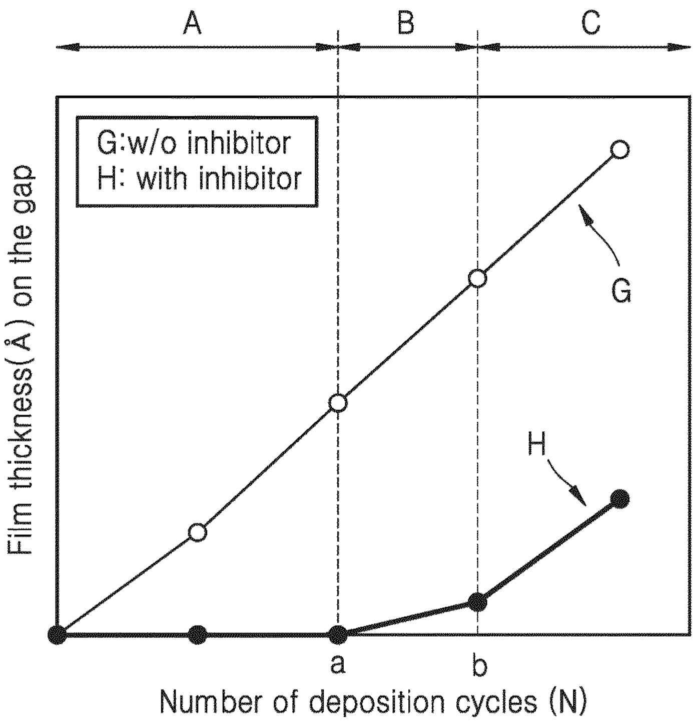
FIG. 3 is a graph for schematically comparing the thicknesses of films in cases in which a deposition inhibiting gas is used and is not used, respectively.

FIG. 3 is a graph for schematically comparing the thicknesses of films in cases in which a deposition inhibiting operation (i.e., the first operation in FIG. 2) is not used (G), and is used (H), respectively.

Referring to FIG. 3, the horizontal axis of the graph represents the number of times of performing a deposition operation (i.e., the second operation), and the vertical axis represents the thickness of a film grown on the gap structure. In a case in which a deposition inhibiting region does not exist (G), a film is proportionally formed on the gap structure as the deposition operation is repeated.

On the other hand, in a case in which a deposition inhibiting region exists (H), a film is not formed on the gap structure due to the deposition inhibiting region until the number of times of deposition reaches a certain number a of times (section A). Section A may be referred to as a non-recovery state in that the deposition inhibiting region exists on the surface even though the deposition operation is repeated, or may be referred to as an incubation period in that a film is not formed even though the deposition operation is repeated.

Thereafter, as the deposition inhibiting region is partially removed by repeating the deposition operation, the film may partially, discontinuously, and slowly grow (section B). Accordingly, the gradient of the growth of the film is less than that in the case (G) in which the deposition inhibiting region does not exist.

Section B may be referred to as an insufficient recovery state in that the surface from which the deposition inhibiting region is removed partially exists as the deposition operation is repeated, but is not completely recovered to the state before the formation of the deposition inhibiting region.

Thereafter, when the deposition operation is performed a certain number b of times or more, the deposition inhibiting region is completely removed, and thus, there is no difference in the growth rate of the film (i.e., the gradient) from the case (G) in which a deposition inhibiting layer does not exist (section C).

Section C may be referred to as a sufficient recovery state in that the deposition inhibiting region is substantially completely removed, and thus is completely recovered to a state before its formation.

It may be seen, from FIG. 3, that deposition of a film may actually be inhibited by the deposition inhibiting gas, and that the number N of repetitions of the second operation needs to be at least greater than the number a in order to deposit the film on the gap structure.

(a) to (f) of FIG. 4 are cross-sectional views conceptually illustrating a process in which a void is formed when a thin film is deposited by using the gap filling method of FIG. 2 on a non-vertical gap structure. Descriptions similar to or the same as those of the gap filling method of FIG. 2 provided above will be omitted.

A gap 41 may be a shallow trench isolation (STI) generally used to define an active region of a semiconductor device in a semiconductor manufacturing process, and may be various types of recess regions formed on the surface of a substrate 40. In addition, the gap 41 may be in the form of a via penetrating a conductive layer between insulating layers or a via penetrating an insulating layer between conductive layers.

The cross-sectional shape of the surface of the gap 41 may be not only a circular shape but also various polygonal shapes, such as an ellipse, a triangle, a quadrangle, or a pentagon. In addition, the gap 41 may have an island shape having various surface cross-sectional shapes. Also, the gap 41 may have a line shape on the substrate 40. Hereinafter, unless otherwise specified, the size of the cross-sectional area of the surface extending in the horizontal direction of the gap 41 will be described based on the width thereof.

Figure 1:
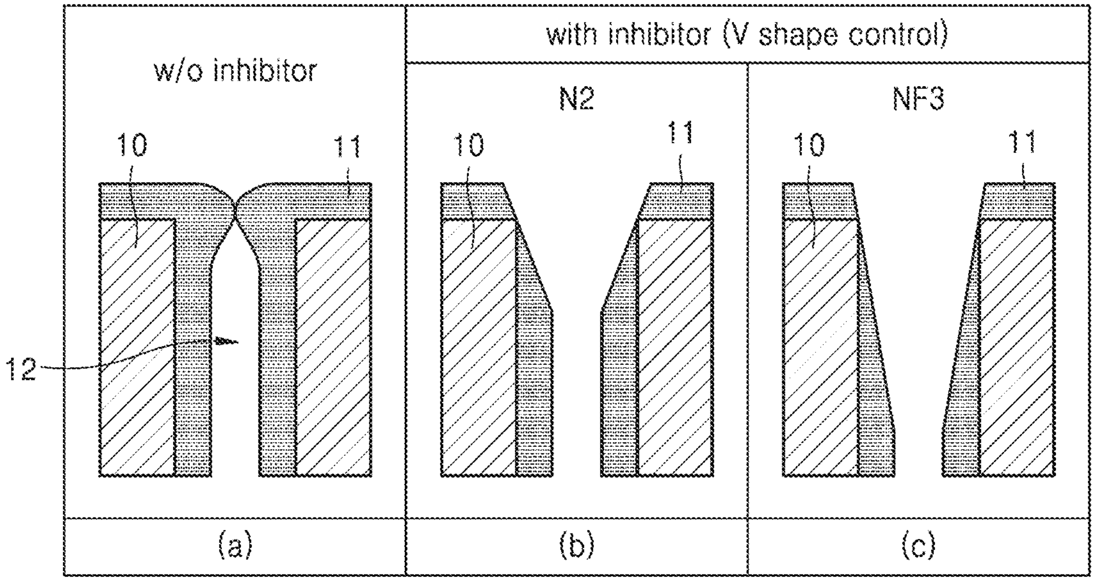
FIG. 1 is a diagram for comparing deposition profiles according to whether a deposition inhibiting gas is used in a gap filling process in the art.

On the other hand, the gap 41 may have a vertical profile having a substantially equal width from the inlet region to the lower region of the gap as illustrated in FIG. 1, but the gap 41 may have a non-vertical profile in which the width increases or decreases from the inlet region to the lower region of the gap. In addition, the gap 41 may have a non-vertical profile in which the width increases and then decreases, or the width decreases and then increases. In addition, the gap 41 may have a three-dimensional internal structure including a plurality of protrusions in the gap 41, as in a stacked gap structure such as 3D NAND, which is a semiconductor integrated circuit device.

Referring back to FIG. 4, a non-vertical gap structure including the gap 41 in which the width of the gap 41 is greater in a middle region than that in an upper region and a lower region along the vertical direction, in a part of the surface of the substrate 40 is illustrated. As illustrated in (a) of FIG. 4, the vertical cross-sectional shape of the gap 41 has a shape in which the width increases from a width Wt of an inlet region of the gap 41 to a width Wm of the middle region thereof. Referring again to (a) of FIG. 4, by the deposition operation of the disclosure, a film 42 as a gap filling material may be formed on the surface of the gap structure including the gap 41. The film 42 may be formed on the exposed surface of the gap structure with a desired thickness.

Referring to (b) of FIG. 4, in a deposition inhibiting operation, a deposition inhibiting gas may be supplied to the substrate 40 on which the gap structure is formed. At least one or a mixture of fluorine-containing gases, such as $NF_3$, $F_2$, $CF_4$, $BrF_3$, $SF_6$, or $ClF_3$, may be used as the deposition inhibiting gas.

Referring to (c) of FIG. 4, as the deposition inhibiting operation (or the first operation) of supplying the deposition inhibiting gas and an operation of depositing the film 42 (or the second operation) is repeatedly performed, the thickness of the film 42 filling the inside of the gap 41 gradually increases. As illustrated in (c) of FIG. 14, the thickness of the film 42 is relatively constant in the lower region of the gap 41, but the formation of the film 42 is suppressed in the upper region of the gap 41, and thus, the deposited film 42 may have an approximately V-shape.

Referring to (d) of FIG. 4, the film 42 maintains the V-shaped profile in the inlet region of the gap 41, but the width Wt in the upper region is less than the width Wm in the middle region of the gap 41, and thus, the inlet region of the gap 41 is first closed, and a void 44 is formed in the gap structure.

Referring to (e) of FIG. 4, as the gap filling process continues, the film 42 may be thickly formed on the void 44.

Subsequently, referring to (f) of FIG. 4, a gap-fill process may be completed by removing the film 42 remaining around the gap 41 through an etch back process or the like for surface planarization while maintaining the void 44 in the gap structure.

It may be seen, from FIG. 4 that, compared to a vertical gap structure, a void is more likely to occur in the non-vertical gap structure that is narrower in the upper region of the gap than in the middle region of the gap. Accordingly, it may be seen that it is necessary to perform the deposition inhibiting operation (i.e., first operation) and the deposition operation (i.e., the second operation) in a more appropriate ratio therebetween when filling the non-vertical gap structure.

In the present specification, the repetition ratio of the first operation (the deposition inhibiting operation) to the second operation (the deposition operation) is defined as a control knob (CK). For example, when CK=20, the first operation (t1 to t3 in FIG. 2) is performed once (i.e., M=1) and the second operation (t4 to t8 in FIG. 2) is repeated 20 times (i.e., N=20), which constitutes one super-cycle, and the gap-fill process is performed while such a super-cycle is repeated a plurality of times.

FIG. 5 is a diagram for comparing the occurrence of voids and/or pores in a non-vertical gap structure according to a CK. In the present embodiment, nitrogen trifluoride ($NF_3$) was used as a deposition inhibiting gas, argon was used as a purge gas and/or a carrier gas, a silicon-containing gas was used as a source gas, and oxygen was used as a reaction gas.

(a) of FIG. 5 shows that voids are formed in a gap when a process of depositing a film 51 on the gap structure 50 is performed without performing a deposition inhibiting operation in a gap filling process for a non-vertical gap structure.

(b) of FIG. 5 shows that voids are formed in a gap when the repetition ratio, i.e., the CK value, is too high in a gap filling process for a non-vertical gap structure (in this case, CK=30). In a case in which the CK is too high, the number of repetitions of the deposition inhibiting operation is relatively low, and thus, the number of times of supply and the supply flow rate of a deposition inhibiting gas (in this case, fluorine ions) are relatively low such that a deposition inhibiting region and its width in the upper region of a gap are small such that the upper region of the gap may be first closed. Accordingly, in this case, although a void V may be formed in the gap after the gap-fill process, the size of the void V may be smaller than that in (a) FIG. 5 in which no deposition inhibiting operation is performed.

On the other hand, in a case in which the CK value is excessively low, for example, in a case in which the second operation is repeated 10 times or less and the first operation is performed once (i.e., CK≤10), the contribution of the deposition inhibiting operation is dominant, and thus, the deposition inhibiting region extends from the upper region to the lower region of the gap such that no film is deposited or a significantly thin film is deposited, and thus, a V-shaped deposited film cannot be obtained. Therefore, it is necessary to have an appropriate CK value in order to obtain a V-shaped deposited film by maintaining the width (or the cross-sectional area) of the upper region of the gap to be wider than that of the lower region.

(c) of FIG. 5 shows that pores P are formed at an upper portion of a gap when the repetition rate, i.e., the CK value, is appropriately set in a gap filling process for a non-vertical gap structure (in this case, CK=20). In a case in which the CK is low, the number of times of the deposition inhibiting operation relatively increases, and thus, the number of times of supply and the supply flow rate of fluorine ions relatively increase. In addition, because fluorine has high deposition inhibiting power, the gap has a V-shaped profile in which the cross-sectional area of the upper region of the gap is wider than that of the lower region, and thus, bottom-up gap filling may be performed without the formation of a void inside the gap. From this, it may be seen that the presence or absence of voids and/or the number of voids may be adjusted by adjusting the CK value.

However, as described above, when using a strong inhibiting gas such as fluorine, fluorine (F) remains in the deposited film, which may result in incomplete deposition. In particular, excess fluorine may remain in the upper region of the gap in which the deposition inhibiting region is intensively formed, and accordingly, pores may be formed in the upper portion of the gap during the deposition operation ((c) of FIG. 5). As described above, in a case in which an appropriate CK value is set, a gap may be filled without formation of voids in the gap, but an issue arises in that pores are formed at the upper portion of the gap. Thus, the disclosure aims to fill a gap in a void-free manner while removing fluorine (F) components that may remain in a film during a gap filling process.

FIG. 6 is a diagram for comparing a deposition profile according to the number of repetitions of the second operation with respect to the number of repetitions of the first operation, with a deposition profile in a case in which no deposition inhibiting gas is used. That is, FIG. 6 shows the width and depth of a deposition inhibiting region and the shape of a deposited film in a gap structure according to a CK value.

(a) of FIG. 6 shows a case of CK=30, (b) of FIG. 6 shows a case of CK=16, and (c) of FIG. 6 is a graph for comparing the relative thickness of the deposited film based on a case in which no deposition inhibiting operation is performed. In (c) of FIG. 6, the horizontal axis represents the relative thickness based on the thickness of the film deposited on the gap structure when no deposition inhibiting gas is used, and the vertical axis represents the depth of the gap in the gap structure. For example, the thickness of the deposited film in the case in which no deposition inhibiting gas is used was set to 1.0 as a reference, and based on this, the thicknesses of deposited films according to the depths of gaps according to CK values are relatively compared with each other.

Meanwhile, the point at which the thickness of the deposited film approximately coincides with that in the case in which no deposition inhibiting gas is used as the depth increases, which is a reference for relative comparison is referred to as a deposition inhibition end point, and in the case of CK=30, the deposition inhibition end point is 'a', and in the case of CK=16, the deposition inhibition end point is 'b'. From this, it may be seen that, as the CK value decreases, the deposition inhibition end point moves to a lower region, and that, as the CK value decreases, the deposition inhibiting region may be formed deeper. Thus, the vertical position of the deposition inhibition end point may be controlled by adjusting the CK value, and accordingly, the position of a void formed in the gap may be adjusted.

In addition, it may be seen, from FIG. 6, that, as the CK value decreases, the thickness of the film deposited in an upper portion of the gap decreases. In detail, at a depth=0 nm, in the case of CK=16, only a thin film with 40% of the thickness of the case in which no deposition inhibiting gas is used was deposited, whereas in the case of CK=20, a thin film with 68% of the thickness of the case in which no deposition inhibiting gas is used was deposited. From this, it may be seen that as the CK value decreases, more deposition inhibiting regions are formed in the upper portion of the gap.

Accordingly, the shape of the deposited film deposited inside the gap in the gap structure may be controlled into, for example, a V shape, by adjusting the CK value.

FIGS. 7A and 7B are diagrams for comparing fluorine concentrations in an upper region, a middle region, and a lower region of a gap structure on which the gap filling process in (c) of FIG. 5 is completed. That is, FIG. 7A shows a result of performing the gap filling process in which the first operation is performed once (i.e., M=1), the second operation is repeated 20 times (i.e., N=20), i.e., CK=20, and nitrogen trifluoride ($NF_3$) is used as a deposition inhibiting gas. As described above with reference to (c) of FIG. 5, it may be seen, from the result of performing the gap filling process with these conditions, that, although no voids were formed inside the gap, incomplete deposition has occurred, for example, pores were formed in the upper portion of the gap.

FIG. 7B is a graph of results obtained by performing electron energy loss spectroscopy (EELS) analysis on the structure of FIG. 7A.

Referring to FIG. 7B, it may be confirmed that the fluorine concentration of the inside of a thin film deposited in an upper region E1 of the gap is greater than those in a middle region E2 and a lower region E3 of the gap. From the EELS analysis, the inventor of the disclosure thought that the cause of formation of pores at the upper portion of the gap was fluorine remaining in the thin film, that is, excess fluorine.

Accordingly, a method of filling a gap in a void-free manner while removing fluorine (F) components that may remain in a film in a gap filling process was devised as follows.

FIG. 8 is a diagram illustrating a process sequence of a gap filling process according to an additional embodiment. FIG. 8 is a modification of the gap filling process of FIG. 2 and is the same as the gap filling process of FIG. 2 except that a removal operation (a third operation in FIG. 8) is added. Thus, the descriptions provided above will be omitted in describing the following embodiments.

Referring to FIG. 8, the gap filling process according to additional embodiments may largely include a deposition inhibiting operation (a first operation in FIG. 8), a deposition operation (a second operation in FIG. 8), and a removal operation (the third operation in FIG. 8). The first operation and the second operation of FIG. 8 are the same as or almost similar to the first operation and the second operation of FIG. 2, and thus, descriptions thereof will be omitted.

After forming a thin film having a certain thickness through the second operation, a third operation of removing a deposition inhibiting region by supplying a source gas on the thin film may be performed. In detail, the operation of removing the deposition inhibiting region may be performed by performing, a plurality of times, the third operation including supplying the source gas on the thin film without substantial reaction gas, supplying RF power, and purging residue. The third operation may be repeated one or more times (i.e., Y≥1), and the deposition inhibiting region may be removed as the third operation is repeated. Sub-operations included in the third operation are as follows.

Ninth Sub-Operation (t9) and Tenth Sub-Operation (t10)

An operation (t9) of supplying a source gas on a thin film may be performed. The source gas may be the same as the source gas used during the thin film deposition operation (i.e., the second operation). In the operation (t9), the source gas may be provided without substantial reaction gas that is reactive or may be reactive in a plasma atmosphere with the source. Moreover, no reaction gas may be provided during the operation (t10) and the operation (t11).

In some embodiments, the source gas is a silicon precursor containing silicon, and may include, for example, at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; dimer-trisilylamine, trimer-trisilylamine, tetramer-trisilylamine, pentamer-trisilylamine, hexamer-trisilylamine, heptamer-trisilylamine, octamer-trisilylamine, and a mixture thereof.

In some embodiments, the flow rate for supplying the source material may be about 100 sccm to about 3000 sccm.

In a preferred embodiment, the source gas may react with a residual deposition inhibiting gas (e.g., fluorine). In detail, the source gas may be activated by applying plasma to the reaction space during the tenth sub-operation, and the activated source gas may remove the residual deposition inhibiting gas. For example, in a case in which a fluorine-containing gas is used as the deposition inhibiting gas and a silicon-containing gas is used as the source gas, the activated silicon gas may react with and remove fluorine remaining in the deposition inhibiting region. Because excess fluorine remains mainly at an upper portion of the gap, it may be preferable to remove the excess fluorine remaining at the upper portion of the gap by using high-frequency RF power during the tenth sub-operation (t11).

Because the source gas used during the deposition process is used to remove the residual deposition inhibiting gas, the properties of the deposited film, in particular the film thickness, are not changed during the removal operation (i.e., the third operation). In addition, when hydrogen ($H_2$) or ammonia (($NH_3$)) plasma is used to remove residual fluorine, HF or $NF_3$ is produced as a residual by-product such that the deposited film is etched and/or the etch rate of the film is changed, whereas, when a source gas (e.g., a silicon-containing gas) is used, the thin film may not be etched and the etch rate of the thin film may not be changed. In addition, when hydrogen ($H_2$) or ammonia (($NH_3$)) plasma is used to remove residual fluorine, an additional gas supply system for supplying hydrogen or ammonia gas is required. However, because a conventional gas supply system may be used when a source gas used in a thin film deposition process is used, an additional gas supply system is not required.

In the present embodiment, the source gas is used for removing the residual deposition inhibiting gas, but it may also be possible to remove the residual deposition inhibiting gas by using at least one of the gases used during the deposition operation. In detail, it may also be possible to remove the residual deposition inhibiting gas by using the reaction gas or the purge gas used during the deposition operation. However, such a reaction gas or purge gas needs to have a reactivity with the deposition inhibiting gas (e.g., fluorine) and be capable of removing the remaining deposition inhibiting gas. For example, by using oxygen ($O_2$), which is a reaction gas used during the deposition operation, the deposition inhibiting region may be removed by a reaction shown in the following chemical formula.

$$2F^- + (½)O_2 + (\text{ionization energy\_} \rightarrow 2F^-O^{2+} \rightarrow OF_2(\uparrow)$$

However, it is more preferable to use, as the deposition inhibiting gas, a source gas rather than a reaction gas. In detail, the source gas may more effectively remove the residual deposition inhibiting gas than does the reaction gas, and may contribute to repairing defects that may occur while removing the residual deposition inhibiting gas. In more detail, the source gas supplied during the ninth sub-operation (t9) may remove the remaining deposition inhibiting gas, and part of the source gas may remain inside the thin film and then react with the reaction gas in the subsequent thin film deposition process such that a stoichiometric defect occurring during the third operation, that is, a non-uniform composition ratio of the film, may be repaired, thereby contributing to recovery of the composition ratio of the film.

Eleventh Sub-Operation (t11)

Thereafter, the reaction space may be purged. The application of the plasma may be stopped to purge the reaction space.

In some embodiments, the purge may be performed by continuously flowing, during the eleventh sub-operation (t11), the carrier gas used in the above-described plasma applying operation. As the flow rate of the carrier gas, for example, about 1000 sccm to about 6000 sccm of Ar or $N_2$ may be supplied. In the purge operation, residual gas remaining in the reactor may be removed. The time period during which the purge is performed (i.e., the duration of the eleventh sub-operation (t11)) may be about 0.1 second to about 1 second.

The above sub-operations t9 to t11 may constitute the third operation, and the third operation may be repeated one or more times until the deposition inhibiting region is sufficiently removed (Y≥1).

The ratio of the number of repetitions of the first operation (M) to the number of repetitions of the third operation (Y) may be about 1:1 to about 1:50. The ratio of M to Y may be determined considering the type of the deposition inhibiting gas used, the type of the source gas used, process conditions, and the like. When the ratio of M to Y is too high (i.e., when Y is excessively high), the source gas may be excessively used, and the deposition inhibiting effect may be reduced. When the ratio of M to Y is too low (i.e., when Y is excessively low), the remaining deposition inhibiting gas may not be sufficiently removed, and thus, pores may be formed in the thin film. From this, it may be seen that the presence of pores in the gap and/or the number of pores may be controlled by adjusting the ratio of the number of repetitions (M) of the first operation to the number of repetitions (Y) of the third operation.

The first to third operations may constitute a super-cycle for forming the film, and the super-cycle may be performed one or more times (X times) until the gap is filled. The first to third operations may be repeated with a certain ratio therebetween. Preferably, the ratio of the number of repetitions (M) of the first operation, the number of repetitions (N) of the second operation, and the number of repetitions (Y) of the third operation in the super-cycle may preferably be 1:20:10. By repeating the operations with this ratio several times (X times), the gap may be filled in a bottom-up manner. In an additional embodiment, by adjusting the repetition ratio (i.e., M:N:Y) of the first, second, and third operations, at least one of the presence of voids in the gap, the number of voids, the presence of pores, and the number of pores may be controlled.

Table 1 below shows an example of experimental conditions under which the above-described embodiment of FIG. 8 is performed. In Table 1, the source gas is a Si precursor, the reaction gas is oxygen ($O_2$), the deposition inhibiting gas is nitrogen trifluoride ($NF_3$), and the carrier and purge gases are argon (Ar). Also, the experiment was carried out at 300° C. to 550° C.

TABLE 1

| | | Inhibiting operation (first operation) | Film deposition operation (second operation) | Residual fluorine removing operation (third operation) |
|---|---|---|---|---|
| Gas Flow (sccm) | Carrier Ar | | 1,000 to 3,000 | |
| | $O_2$ | 0 | 500 to 1,500 | 0 |
| | Purge Ar | 500 to 2,000 | 200 to 500 | 500 to 1,500 |
| | $NF_3$ | 5 to 50 | 0 | 0 |
| | Bottom filling $N_2$ | | 100 to 500 | |
| Operation Time (sec) | Source feed | 0 | 0.1 to 1.0 | 0.1 to 1.0 |
| | Purge | 0.1 to 1.0 | 0.1 to 1.0 | 0.1 to 1.0 |
| | RF-ON | 0.1 to 1.0 | 0.1 to 1.0 | 0.1 to 1.0 |
| | Purge | 0.1 to 1.0 | 0.1 to 1.0 | 0.1 to 1.0 |
| etc | RF power (W): HRF/LRF | 50 to 200/ 50 to 100 | 1,000 to 3,000/0 | 100 to 300/0 |
| | RF frequency HRF/LRF | 10 MHz to 30 MHz/ 300 KHz to 500 KHz | 10 MHz to 30 MHz/ | 10 MHz to 30 MHz/ |
| | Pressure (Torr) | | 1 to 4 | |

In Table 1, at least one of silane, aminosilane, and iodosilane may be used as the Si source. For example, at least one of TSA-based mixtures, such as TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS; $SiH_3N(iPr)$ 2; TEOS, $Si(OEt)_4$; $SiCl_4$; HCD, $Si_2Cl_6$; 3DMAS, $SiH(N(Me)_2)_3$, BEMAS, Si $H_2[N(Et)(Me)]_2$; AHEAD, $Si_2$ $(NHEt)_6$; TEAS, $Si(NHEt)_4$; $Si_3H_8$; DCS, $SiH_2Cl_2$; $SiHI_3$; $SiH_2I_2$; TSA (trisilyamine), or trimer-trisilyamine, a derivative and a group thereof, and a mixture thereof may be used.

The silicon oxide film was presented as an example in the above embodiments, but the disclosure is not limited thereto. For example, by supplying a nitrogen-containing gas instead of an oxygen-containing gas in the operation of supplying the reaction gas, a silicon nitride layer may be formed, and then a void- and pore-free silicon nitride layer gap filling process may be performed by performing a deposition inhibiting region removal operation.

In the first operation step for forming an inhibiting layer may comprise supplying a small amount of fluorine-containing gas, while supplying low RF power in order to form a small amount of activated fluorine-containing gas. This may result in non-conformal distribution of inhibition gas along the surface of the gap, i.e. more fluorine-terminated sites at an upper region than at a lower region of the gap.

In one embodiment as shown in Table 1, in the first operation step, a fluorine-containing gas (e.g. $NF_3$) at 50 sccm or less may be supplied, while supplying a high frequency RF power (HRF) of 200 W or less and/or a low frequency RF power (LRF) of 100 W or less to the reactor. The high frequency thereof may be 10 MHz to 30 MHz, and the flow frequency thereof may be 300 KHz to 500 KHz.

In addition, it should be noted that the disclosure is not limited to the above embodiments. For example, the above embodiment was performed at a temperature of 300° C. to 550° C., but is not limited thereto, and may be implemented at other temperature ranges as well.

FIG. 9 is a flowchart of a gap filling process according to additional embodiments, and FIG. 10 schematically illustrates a method of forming a film according to additional embodiments. In FIG. 10, it is assumed that the source gas is a Si precursor, the reaction gas is oxygen ($O_2$), the deposition inhibiting gas is nitrogen trifluoride ($NF_3$), and the carrier and purge gases are argon (Ar). Hereinafter, FIG. 9 will be described with reference to FIGS. 8 and 10. The descriptions provided above will be omitted in describing the following embodiments.

First, a substrate including a gap structure is provided into a reaction space. The substrate may be any one of various substrates used for semiconductor devices or display devices, and the gap may have a vertical profile with a constant cross-sectional area in the vertical direction, and, preferably, may have any one of various non-vertical profiles in which the cross-sectional area increases or decreases.

A first operation S10 of forming a deposition inhibiting region by supplying a deposition inhibiting gas on the structure including the gap may be performed. In detail, an operation of forming the deposition inhibiting region on the gap structure may be performed by performing, a plurality of times (M cycles), the first operation S10 including supplying the deposition inhibiting gas on the structure including the gap (t1 and t2 of FIG. 8), supplying RF power (t2 of FIG. 8), and purging residue (t3 of FIG. 8). The first operation S10 may be repeated one or more times (i.e., M≥1), and as the first operation S10 is repeated, the deposition inhibiting effect may increase.

As described above, as the deposition inhibiting gas, a nitrogen-containing gas, for example, at least one of $N_2$, $NH_3$, $N_2$+$H_2$, and a mixture thereof, may be used. In another example, at least one and a mixture of fluorine-containing gases having strong reducing power, such as $NF_3$, $F_2$, $CF_4$, $BrF_3$, $SF_6$, or $ClF_3$, may be used as the deposition inhibiting gas. In another example, the deposition inhibiting gas may be a halogen-containing compound, and may be, for example, a compound containing fluorine (F), chlorine (Cl), bromine (Br), iodine (I), or the like.

In an additional embodiment, the deposition inhibiting gas may be activated by applying plasma to a reaction space in which the substrate is mounted. The plasma may be generated by supplying RF power to the reactor. The activated deposition inhibiting gas may leave a layer of ionized nitrogen or halogen element on the gap structure, which may constitute a deposition inhibiting region or a portion thereof. For example, as illustrated in (a) of FIG. 10, fluorine active species may adsorb on the surface of the gap structure to form fluorine-terminated sites, leaving a fluorine layer. The fluorine-terminated sites may form a deposition inhibiting region capable of inhibiting deposition of a film due to strong reducing power thereof. It may be seen, from (a) of FIG. 10, that more fluorine-terminated sites, i.e., deposition inhibiting regions, are formed at the upper region of the gap than at the low region of the gap. Thus, by this operation, deposition of a film in the upper region of the gap may be inhibited such that the gap has a V-shaped profile in which the cross-sectional area of the upper region of the gap is wider than that of the lower region.

In an additional embodiment, as described above, in order to uniformly form a deposition inhibiting region on the sidewall and lower surface of the gap, dual RF frequency power, that is, high-frequency RF power and low-frequency RF power, may be simultaneously supplied to the reaction space. By supplying the high-frequency power and the low-frequency power together, high-density, stable plasma may be provided to increase the ion density of fluorine ions and the travel distance of the fluorine ions.

When the deposition inhibiting region is sufficiently formed, a deposition operation S20 of forming a thin film on the gap structure may be performed. In detail, an operation of forming the thin film on the structure may be performed by performing, a plurality of times (N cycles), the second operation S20 including supplying a source gas on the gap structure (t4 of FIG. 8), supplying a reaction gas (t4 to t7 of FIG. 8), supplying RF power (t6 of FIG. 8), and purging residue (t7 of FIG. 8). The second operation S20 may be repeated one or more times (i.e., N≥1).

As described above, the source gas and the reaction gas may be selected according to the type of a film to be formed on the substrate. For example, the film may be a silicon oxide layer, the source gas may be a silicon precursor containing silicon, and the reaction gas may be an oxidizing agent containing oxygen.

Referring to (b) of FIG. 10, by supplying the source material (in this case, a silicon precursor), the source material may be adsorbed to an adsorption site on the gap structure to which the source material may be adsorbed. As described above, because the deposition inhibiting region is formed on the gap structure, absorption of the source material may be extremely limited at the beginning of the second operation S20 of forming the film. However, as the second operation is repeated, the number of times of purging increases and the deposition inhibiting region is gradually removed, and accordingly, the range in which the source gas is adsorbed may gradually increase. Because the deposition inhibiting region is mainly formed on the upper portion of the gap structure, the source material will be mainly adsorbed on the lower portion of the gap structure.

Thereafter, a reaction gas (in the case of (b) of FIG. 10, oxygen ($O_2$)) may be supplied to the reaction space, and the reaction gas may be activated by applying plasma. As illustrated in (b) of FIG. 10, the activated oxygen may react with the source material adsorbed on the gap structure to form an oxide. For example, the activated oxygen may react with a silicon source material that is previously adsorbed, and thus form a silicon oxide film ($SiO_2$).

As described above, the ratio of the number of repetitions (M) of the first operation to the number of repetitions (N) of the second operation may be determined considering the type of the deposition inhibiting gas used and deposition conditions, and may be about 1:15 to about 1:40. As the first operation and the second operation are performed, the gap may be filled without forming a void.

Referring back to FIG. 9, after forming the thin film having a certain thickness through the second operation S20, a third operation S30 of removing the deposition inhibiting gas remaining in the gap by supplying the source gas to the gap structure may be performed. In detail, an operation of removing the residual deposition inhibiting gas (S30) may be performed by performing, a plurality of times (Y cycles), the third operation S30 including supplying the source gas to the thin film (19 of FIG. 8), supplying RF power (t10 of FIG. 8), and purging residue (t11 of FIG. 8). The third operation S30 may be repeated one or more times (i.e., Y≥1), and as the third operation (S30) is repeated, the residual deposition inhibiting gas may be removed from the film and formation of pores may be suppressed.

The source gas used during the operation of removing of the residual deposition inhibiting gas (S30) may be the same as the source gas used during the thin film deposition operation (S20). For example, a silicon-containing gas may be used as the source gas during the second operation (S20) and the third operation (S30).

In a preferred embodiment, the source gas may react with the residual deposition inhibiting gas in the deposition inhibiting region to remove the residual deposition inhibiting gas (e.g. $Si^{*}+F \rightarrow SiF_4$). In detail, as illustrated in (c) of FIG. 10, the silicon-containing gas may be activated by applying plasma to the reaction space, and the activated silicon-containing gas may remove the fluorine-terminated site formed in the first operation S10. As described above, because excess fluorine remains mainly at the upper portion of the gap, it may be preferable to remove the deposition inhibiting gas remaining at the upper portion of the gap by using high-frequency RF power during the third operation S30.

Referring back to FIG. 9, after the residual deposition inhibiting gas is sufficiently removed in the third operation S30, it is determined whether the gap is filled (S40). When it is determined that the gap is filled, the gap filling process is terminated, and when it is determined that the gap is not yet filled, the first operation S10 to the third operation S30 may be repeatedly performed.

FIGS. 11 to 14 are experimental results obtained by performing an embodiment by using the process conditions in Table 1 above. Hereinafter, it is assumed that the source gas is a Si precursor, the reaction gas is oxygen ($O_2$), the deposition inhibiting gas is nitrogen trifluoride ($NF_3$), and the carrier and purge gases are argon (Ar).

FIG. 11 is a graph for schematically comparing fluorine concentrations according to depth in a case in which the residual-fluorine removal operation (S30) of FIG. 9 is performed according to additional embodiments and a case in which the residual-fluorine removal operation is not performed.

It may be seen, from FIG. 11, that, in a case in which the deposition inhibiting gas (i.e., nitrogen trifluoride ($NF_3$)) is not used, no fluorine is found in the material film after the gap filling process is completed. In addition, it was confirmed that more fluorine is present in the film in which relatively more deposition inhibiting gas is used (e.g. CK=20), because the contribution of the deposition inhibiting operation is dominant as the CK value is lower. Furthermore, it was confirmed that the fluorine content in the film may be significantly reduced in a case in which CK=20 and the third operation of removing residual fluorine (i.e., the residual-fluorine removal operation (t9 to t11 in FIG. 8)) is repeated 10 times, compared to a case in which CK=20 and the third operation is not performed. That is, it was confirmed, from the graph of FIG. 11, that excess fluorine was removed by additionally performing the residual-fluorine removal operation (the third operation S30 of FIG. 9).

FIG. 12 is a diagram for comparing the occurrence of voids and/or pores in a gap structure in a case in which a removal operation (the third operation S30 of FIG. 9) is performed according to additional embodiments and in a case in which the removal operation is not performed.

Comparing (c) with (d) of FIG. 12, it was confirmed that, in a case in which CK=20 and the third operation (19 to t11 of FIG. 8) of removing residual fluorine remaining in the deposition region was not performed ((c) of FIG. 12), pores were formed in the film deposited at the upper portion of the gap, whereas, in a case in which CK=20 and the third operation was performed 10 times, the gap is completely filled without forming pores as well as voids. From this, it was confirmed that excess fluorine was removed by the residual-fluorine removal operation (the third operation S30 of FIG. 9), and accordingly, pores were not formed in the film.

FIG. 13 is a diagram for comparing deposition profiles in a case in which the residual-fluorine removal operation (the third operation S30 in FIG. 9) is performed according to additional embodiments and in a case in which the residual-fluorine removal operation is not performed.

In FIG. 13, the horizontal axis represents the relative thickness based on the thickness of the film deposited on the gap structure when a deposition inhibiting gas is not used, and the vertical axis represents the depth of the gap in the gap structure. For example, the thickness of the deposited film in the case in which a deposition inhibiting gas is not used was set to 1.0 as a reference, and based on this, the thicknesses of deposited films according to CK values and/or whether the residual-fluorine removal operation is performed are relatively compared with each other.

From FIG. 13, it was confirmed that, in a case in which CK=20 and the residual-fluorine removal operation is performed, residual fluorine is removed while a film is additionally formed by the source gas, and thus, a film is deposited slightly more than in a case in which CK=20 and the residual-fluorine removal operation is not performed. However, from the thickness profile of FIG. 13, it may be seen that the V-shaped film profile is maintained almost similarly in a case in which CK=20 and the residual-fluorine removal operation is performed and in a case in which CK=20 and the residual-fluorine removal operation is not performed. From this, it may be confirmed that the thickness profile of the film is hardly changed by the residual-fluorine removal operation according to embodiments.

FIG. 14 is a graph for schematically comparing fluorine concentrations and deposition inhibiting effects in a case in which the residual-fluorine removal operation is performed according to additional embodiments and a case in which the residual-fluorine removal operation is not performed.

As described above, in a case in which the repetition ratio, i.e., the CK value, in the gap filling process is too high, the number of deposition inhibiting operations is relatively low (i.e., the deposition inhibiting ratio is low), and thus, the deposition inhibiting region in the upper region of the gap is small such that the upper region of the gap may be closed first. Thus, voids may be formed in the gap after the gap filling process. On the other hand, in a case in which the CK value is excessively low, the contribution of the deposition inhibiting operation is dominant (i.e., the deposition inhibiting ratio is high), the deposition inhibiting region expands from the upper region to the lower region of the gap such that a film is not deposited or a very thin film is deposited, thus a V-shaped deposited film may not be obtained, and voids may be formed in the gap after the gap filling process. Therefore, in order to fill the gap without forming voids in the gap, it is necessary to have an appropriate CK value, that is, an appropriate deposition inhibiting ratio. For example, as illustrated in FIG. 14, in a case in which the deposition inhibiting ratio is 24% to 38.5%, the gap may be filled without forming voids (Void Free Zone in FIG. 14).

In addition, as described above with reference to FIGS. 11 and 12, it was confirmed that pores were formed when the concentration of fluorine (F) in the film was high. Therefore, in order to fill the gap without forming pores, the concentration of fluorine (F) in the film needs to be less than a particular threshold value. For example, as illustrated in FIG. 14, in a case in which the concentration of fluorine (F) is 0.66 atomic % or less, pores may not be formed in the film (Pore Free Zone in FIG. 14).

A region in which neither voids nor pores are formed in the film is referred to as 'Green Zone' for convenience. That is, Green Zone refers to a range in which the deposition inhibiting ratio is 24% to 38.5% and the concentration of fluorine (F) in the film is 0.66 atomic % or less.

Referring to FIG. 14, a case in which the deposition inhibiting operation is not performed (w/o) belongs to Pore Free Zone but is out of Void Free Zone. That is, in the case in which the deposition inhibiting operation is not performed (w/o), pores may not be formed in the material film, but voids may be formed. In a case in which the deposition inhibiting operation is performed with CK=30, the deposition inhibiting ratio is 23.00% and the concentration of fluorine (F) is 0.66 atomic %, which is at the boundary of Pore Free Zone but is out of Void Free Zone. That is, pores may not be formed, but voids may be formed. In a case in which the deposition inhibiting operation is performed with CK=20, the deposition inhibiting ratio is 38.50% and the concentration of fluorine (F) is 0.95 atomic %, which is out of Pore Free Zone but is at the boundary of Void Free Zone. That is, voids may not be formed, but pores may be formed.

On the other hand, in a case in which the residual-fluorine removal operation is performed with CK=20, the deposition inhibiting ratio is 29.40% and the concentration of fluorine (F) is 0.48 atomic %, which is in Green Zone. From this, it may be seen that in a case in which the residual-fluorine removal operation is additionally performed, excess fluorine (F) may be removed while maintaining an appropriate deposition inhibiting effect.

As described above, from the graph of FIG. 14, it may be seen that the gap may be filled without forming voids and pores by appropriately adjusting the CK, that is, the repetition ratio of the first operation (the deposition inhibiting operation) to the second operation (the deposition operation), and the number of repetitions of the third operation (the residual-fluorine removal operation).

In order to clearly understand the disclosure, it should be understood that the shape of each element in the accompanying drawings is exemplary. It should be noted that the elements may be transformed into various shapes other than the illustrated shapes. Like numerals in the drawings may refer to like elements.

It will be clear to those of skill in the art that the disclosure described above is not limited to the above-described embodiments and the accompanying drawings, and various substitutions, modifications, and changes are possible within the scope of the technical idea of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:

providing a wafer comprising a gap in a reaction chamber;

providing a deposition inhibiting gas comprising a halogen comprising gas in the reaction chamber and subsequently purging the deposition inhibiting gas in the reaction chamber to provide a deposition inhibiting region in a top of the gap;

providing a source gas and a reaction gas in the reaction chamber, supplying a radio-frequency (RF) power, and purging residue gas to deposit a layer in the gap; and providing the source gas without substantial reaction gas in the reaction chamber, supplying a radio-frequency (RF) power, and purging residue to at least partially remove the deposition inhibiting region.

2. The substrate processing method of claim 1, wherein the halogen comprising gas includes a fluorine-containing gas.

3. The substrate processing method of claim 2, wherein the fluorine-containing gas comprises at least one of $NF_3$, $F_2$, $CF_4$, $BrF_3$, $SF_6$, $ClF_3$, and or a mixture thereof.

4. The substrate processing method of claim 1, wherein the source gas supplied during the providing the source gas without substantial reaction gas removes residual fluorine formed in the deposition inhibiting region during the providing the deposition inhibiting gas.

5. The substrate processing method of claim 1, wherein a ratio of a number of repetitions of the providing the deposition inhibiting gas to the number of repetitions of the providing the source gas without substantial reaction gas is about 1:1 to about 1:50.

6. The substrate processing method of claim 1, wherein a width in a middle region of the gap is greater than widths in an upper region and a lower region of the gap.

7. The substrate processing method of claim 6, wherein the providing the deposition inhibiting gas further comprises simultaneously supplying high-RF (HRF) power having a frequency of about 10 MHz to about 30 MHz and low-RF (LRF) power having a frequency of about 300 kHz to about 500 kHz to activate the deposition inhibiting gas.

8. The substrate processing method of claim 6, wherein the RF power of the providing the source gas without substantial reaction gas is HRF power having a frequency about 10 MHz to about 30 MHz, and a residual deposition inhibiting gas is removed, by the providing the source gas without substantial reaction gas, from the deposition inhibiting region formed on an upper portion of the gap.

9. The substrate processing method of claim 1, wherein the providing the deposition inhibiting gas to the providing the source gas without substantial reaction gas are repeatedly performed until the gap is filled.

10. A substrate processing method, comprising:

providing a wafer comprising a gap in a reaction chamber;

providing a deposition inhibiting gas comprising a halogen comprising gas in the reaction chamber and subsequently purging the deposition inhibiting gas in the reaction chamber to provide a deposition inhibiting region in a top of the gap;

providing a source gas and a reaction gas in the reaction chamber, supplying a radio-frequency (RF) power, and purging residue gas to deposit a layer in the gap; and providing the source gas without substantial reaction gas in the reaction chamber, supplying a RF power, and purging residue to at least partially remove the deposition inhibiting region, wherein the source gas is a silicon precursor, and comprises at least one of TSA, $(SiH_3)_3N$; DSO, $(SiH_3)_2(SiH_3)_2O$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2(N(Et)(Me))_2SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; and dimer-trisilylamine, trimer-trisilylamine, tetramer-trisilylamine, pentamer-trisilylamine, hexamer-trisilylamine, heptamer-trisilylamine, octamer-trisilylamine, or a mixture thereof.

11. The substrate processing method of claim 10, wherein a ratio of a number of repetitions of the providing the deposition inhibiting gas to the number of repetitions of the providing a source gas and a reaction gas in the reaction chamber, supplying a RF power, and purging residue gas is about 1:1 to about 1:50.

12. A substrate processing method comprising:
a first operation of forming a deposition inhibiting region on a gap structure by performing, a plurality of times, supplying a deposition inhibiting gas comprising a halogen comprising gas on the gap structure;
a second operation of forming a thin film on the gap structure by performing, a plurality of times, supplying a source gas on the gap structure, supplying a reaction gas, supplying a first radio-frequency (RF) power, and purging residue; and
a third operation of removing a residual deposition inhibiting gas in the deposition inhibiting region by performing, a plurality of times, supplying the source gas that has a reactivity with the residual deposition inhibiting gas on the thin film, supplying second RF power, and purging residue,
wherein a part of the source gas supplied during the third operation reacts with the residual deposition inhibiting gas in the deposition inhibiting region and removes residual fluorine from the deposition inhibiting region.

13. A substrate processing method comprising:
a first operation of forming a deposition inhibiting region on a structure comprising a gap, by supplying a deposition inhibiting gas on the structure;
a second operation of forming a thin film on the gap; and
a third operation of removing a residual deposition inhibiting gas from the deposition inhibiting region by using at least one of gases used during the second operation forming of the thin film,
wherein the at least one of gases has a reactivity with the residual deposition inhibiting gas and removes the residual deposition inhibiting region, and wherein the at least one of the gases reacts with the residual deposition inhibiting gas in the deposition inhibiting region.

14. The substrate processing method of claim 13, wherein a width in a middle region of the gap is greater than a width in an upper region of the gap, and during the third operation, the residual deposition inhibiting gas is removed from the deposition inhibiting region formed on an upper portion of the gap.

15. The substrate processing method of claim 13, wherein a super-cycle is defined as comprising one or more repetitions of the first operation, one or more repetitions the second operation, and one or more repetitions the third operation, and the gap is filled by repeating the super-cycle.

16. The substrate processing method of claim 15, wherein, in the repeating of the super-cycle, the gap is filled without forming voids and pores in the gap, by adjusting a repetition ratio of the first operation, the second operation, and the third operation.

17. A substrate processing method comprising:
providing a substrate comprising a gap into a reaction chamber; and
filling the gap with a film by performing a cyclical deposition process, wherein the cyclical deposition process comprises:
a first operation of supplying a fluorine-containing gas to form more fluorine-terminated sites at an upper region of the gap than at a lower region of the gap;
a second operation of supplying a source gas and a reaction gas to form a thin film on the gap on which the fluorine-terminated sites are formed; and
a third operation of supplying the source gas on the thin film,
wherein the source gas is a silicon-containing gas, has a reactivity with fluorine, and the source gas supplied during the third operation removes excess residual fluorine.

18. The substrate processing method of claim 17, wherein the first operation of supplying the fluorine-containing gas comprises supplying the fluorine-containing gas at 50 sccm or less, while supplying a high frequency RF power of 200 W or less and/or a low frequency RF power of 100 W or less.

19. The substrate processing method of claim 17, wherein the thin film is formed at a lower region of the gap.

20. A substrate processing method, comprising:
providing a wafer comprising a gap in a reaction chamber;
providing a deposition inhibiting gas comprising a halogen comprising gas in the reaction chamber and subsequently purging the deposition inhibiting gas in the reaction chamber to provide a deposition inhibiting region in a top of the gap;
providing a source gas and a reaction gas in the reaction chamber, supplying a radio-frequency (RF) power, and purging residue gas to deposit a layer in the gap; and
providing the source gas without substantial reaction gas in the reaction chamber, supplying a RF power, and purging residue to at least partially remove the deposition inhibiting region, wherein the reaction gas is an oxygen-containing gas, and comprises at least one of $O_2$, $O_3$, $O_2$ plasma, $O_3$ plasma, water vapor, $H_2O$ plasma, NO, NO plasma, $N_2O$, $N_2O$ plasma, $NO_2$, $NO_2$ plasma, hydrogen peroxide, CO, CO plasma, $CO_2$, $CO_2$ plasma, and a mixture thereof.

21. A substrate processing method, comprising:
a first operation of forming a deposition inhibiting region on a structure comprising a gap, by supplying a deposition inhibiting gas on the structure;
a second operation of forming a thin film on the gap; and
a third operation of removing a residual deposition inhibiting gas from the deposition inhibiting region by using at least one of gases used during the second operation,
wherein the at least one of gases has a reactivity with the residual deposition inhibiting gas and removes the residual deposition inhibiting region, and wherein the at least one of the gases reacts with the residual deposition inhibiting gas in the deposition inhibiting region, wherein a stoichiometric defect in the thin film formed on the structure is repaired during the third operation.

* * * * *